US011551758B2

(12) United States Patent
De Santis

(10) Patent No.: US 11,551,758 B2
(45) Date of Patent: *Jan. 10, 2023

(54) MEMORIES CONFIGURED TO PERFORM CONCURRENT ACCESS OPERATIONS ON DIFFERENT GROUPINGS OF MEMORY CELLS

(71) Applicant: MICRON TECHNOLOGY, INC., Boise, ID (US)

(72) Inventor: Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 5 days.

This patent is subject to a terminal disclaimer.

(21) Appl. No.: 17/206,827

(22) Filed: Mar. 19, 2021

(65) Prior Publication Data
US 2021/0210143 A1  Jul. 8, 2021

Related U.S. Application Data

(63) Continuation of application No. 16/454,461, filed on Jun. 27, 2019, now Pat. No. 10,957,393.

(51) Int. Cl.
*G11C 16/08* (2006.01)
*G11C 16/04* (2006.01)
*G11C 16/34* (2006.01)
*G11C 16/26* (2006.01)

(52) U.S. Cl.
CPC .......... *G11C 16/08* (2013.01); *G11C 16/0483* (2013.01); *G11C 16/26* (2013.01); *G11C 16/3459* (2013.01)

(58) Field of Classification Search
CPC ..... G11C 16/08; G11C 16/0483; G11C 16/26; G11C 16/3459
USPC .................................................... 365/185.18
See application file for complete search history.

(56) References Cited

U.S. PATENT DOCUMENTS

| 8,473,948 | B1 | 6/2013 | Le Grand | |
|---|---|---|---|---|
| 10,573,393 | B1 | 2/2020 | Peng et al. | |
| 10,643,713 | B1 | 5/2020 | Louie et al. | |
| 2012/0051161 | A1* | 3/2012 | Grunzke | G11C 7/222 365/194 |
| 2012/0124317 | A1 | 5/2012 | Mirichigni et al. | |
| 2012/0124449 | A1 | 5/2012 | Mirichigni | |
| 2018/0012667 | A1* | 1/2018 | Costa | G11C 16/26 |

(Continued)

*Primary Examiner* — Sung Il Cho
(74) *Attorney, Agent, or Firm* — Dicke, Billig & Czaja, PLLC

(57) ABSTRACT

Memories might include control logic configured to cause the memory to perform a first sense operation having an initial phase and a plurality of sensing phases on a first grouping of memory cells, pause the first sense operation upon completion of a present sensing phase in response to receiving a command to perform a second sense operation on a second grouping of memory cells while performing the present sensing phase, perform an initial phase of the second sense operation after pausing the first sense operation, and, in response to completion of the initial phase of the second sense operation, resume the first sense operation at a next subsequent sensing phase of the plurality of sensing phases and continue to a sensing phase of the second sense operation to perform the next subsequent sensing phase of the first sense operation and the sensing phase of the second sense operation concurrently.

20 Claims, 17 Drawing Sheets

(56) References Cited

U.S. PATENT DOCUMENTS

| | | | |
|---|---|---|---|
| 2019/0348129 A1* | 11/2019 | Chin | G11C 16/0483 |
| 2020/0210364 A1 | 7/2020 | Wilkinson et al. | |
| 2020/0211663 A1* | 7/2020 | Baraskar | G11C 16/3459 |
| 2020/0234776 A1* | 7/2020 | Yamada | G11C 16/3495 |

* cited by examiner

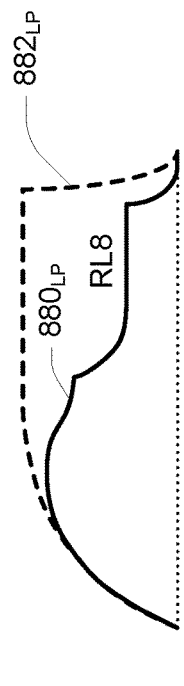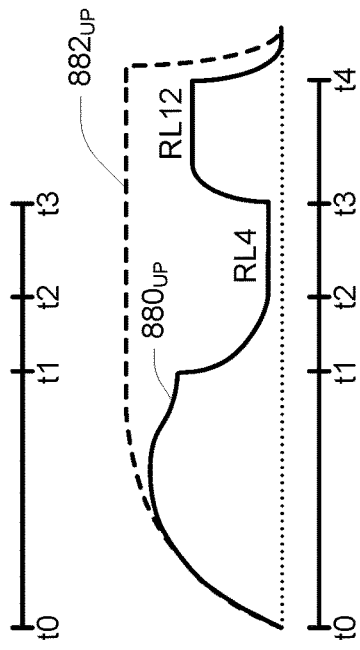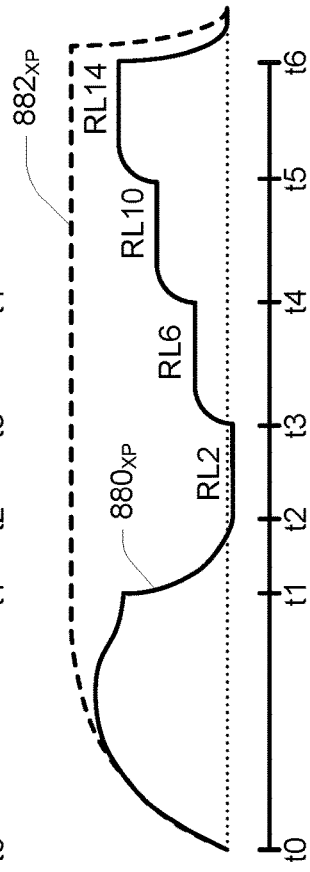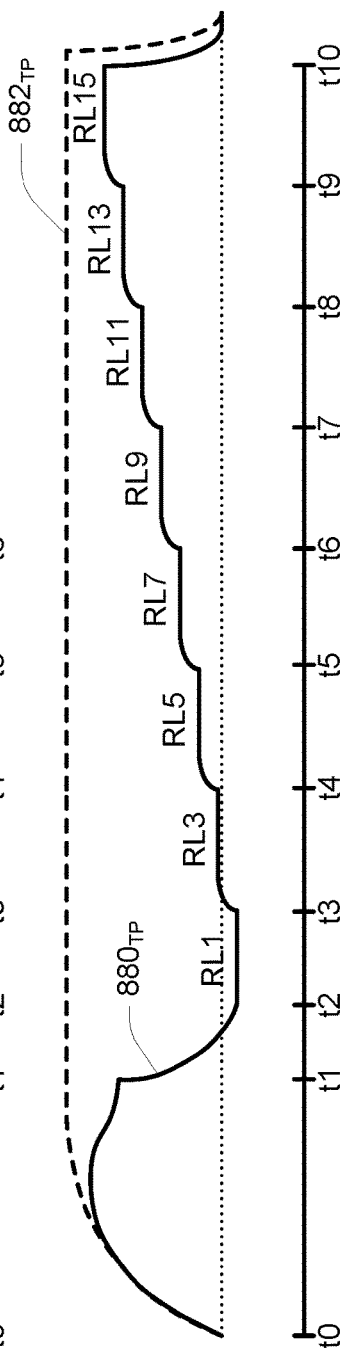
FIG. 8A
FIG. 8B
FIG. 8C
FIG. 8D

MEMORIES CONFIGURED TO PERFORM CONCURRENT ACCESS OPERATIONS ON DIFFERENT GROUPINGS OF MEMORY CELLS

RELATED APPLICATION

This Application is a Continuation of U.S. application Ser. No. 16/454,461, titled "APPARATUS AND METHODS FOR PERFORMING CONCURRENT ACCESS OPERATIONS ON DIFFERENT GROUPINGS OF MEMORY CELLS," filed Jun. 27, 2019, and issued a Pat. No. 10,957,393 on Mar. 23, 2021, which is commonly assigned and incorporated herein by reference.

TECHNICAL FIELD

The present disclosure relates generally to memory and, in particular, in one or more embodiments, the present disclosure relates to apparatus and methods for performing concurrent access operations on different groupings of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is deemed to be activated in response to a particular voltage applied to its control gate, such as by detecting whether a data line connected to the memory cell experiences a sufficient change in voltage level caused by current flow through the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

Threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region.

Threshold voltages of memory cells may further shift due to cumulative charge loss over the age of their programmed data, e.g., a period of time between programming the data and reading the data. Such charge loss can become more pronounced as the data storage structures become smaller.

Furthermore, threshold voltages of memory cells may shift due to read disturb. In read disturb, the threshold voltage of a memory cell may shift in response to the voltage applied to the memory cell to facilitate access to the target memory cell selected for reading, e.g., increasing the threshold voltage of the memory cell.

BRIEF DESCRIPTION OF THE DRAWINGS

FIGS. 8A-8D are timing diagrams of a plurality of different access operations having differing numbers of phases for use with embodiments.

DETAILED DESCRIPTION

Figure 1:
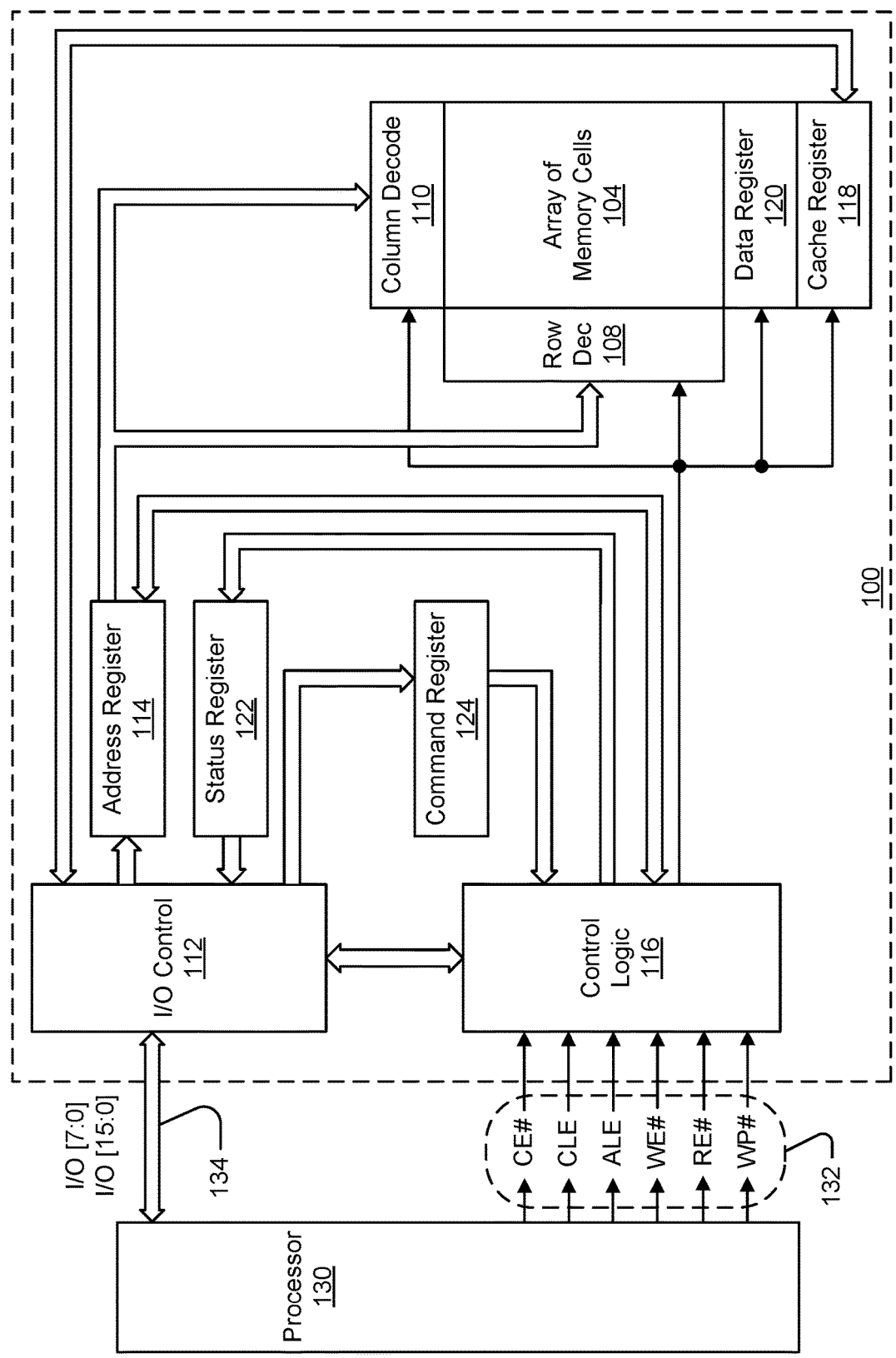
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

As noted above, various phenomena can act to shift and widen threshold voltage distributions, which can make it difficult to accurately determine an intended data state of a memory cell. In addition, concurrent access operations on multiple groupings of memory cells can introduce electrical noise as individual access operations request current from generators to pre-charge nodes, e.g., access line or data lines, to desired voltage levels to perform those access operations. Such electrical noise might further impact the ability to accurately determine an intended data state. Various embodiments seek to mitigate the impact of electrical noise during noise-sensitive periods of the access operations.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
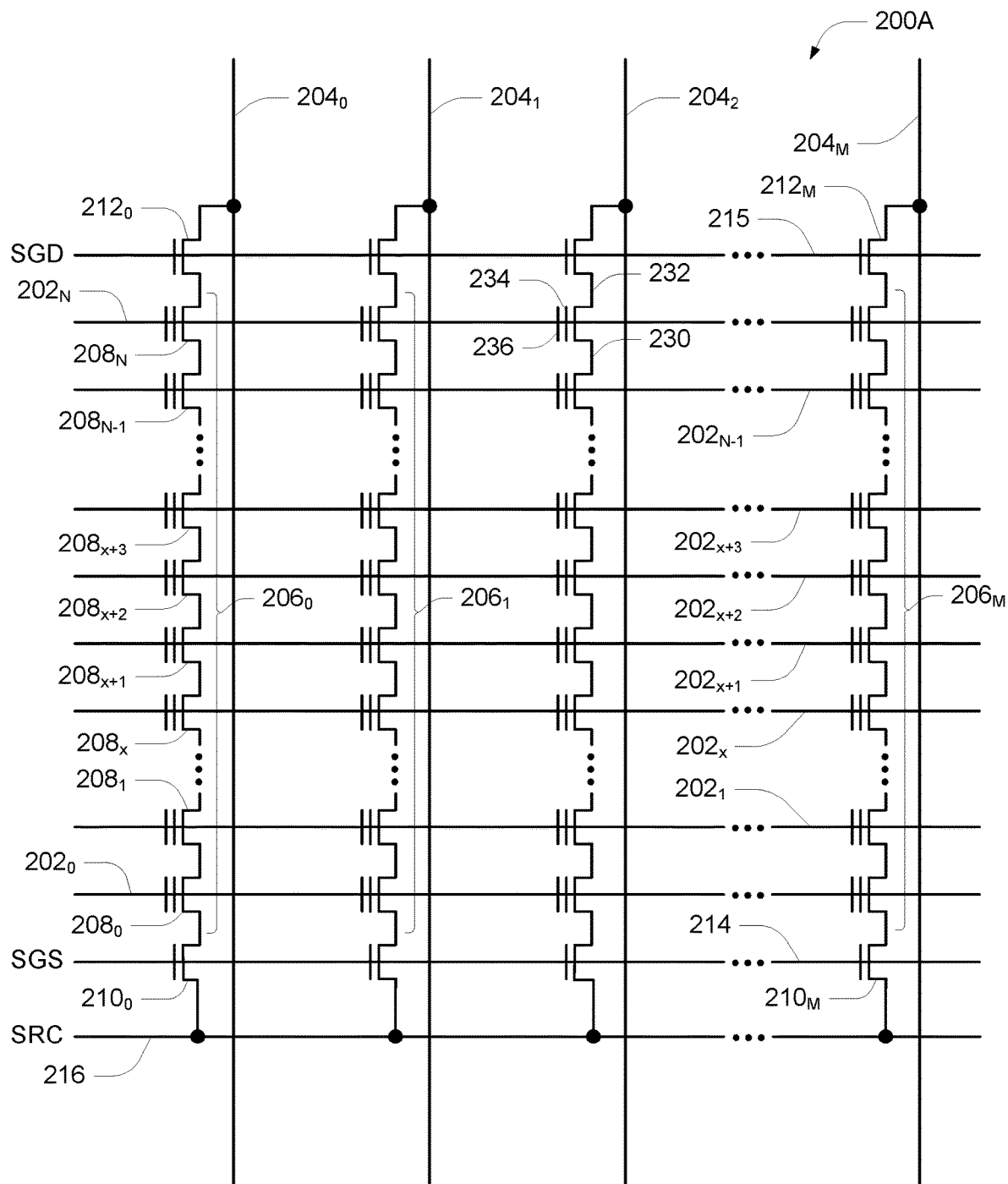
FIGS. 2A-2D are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
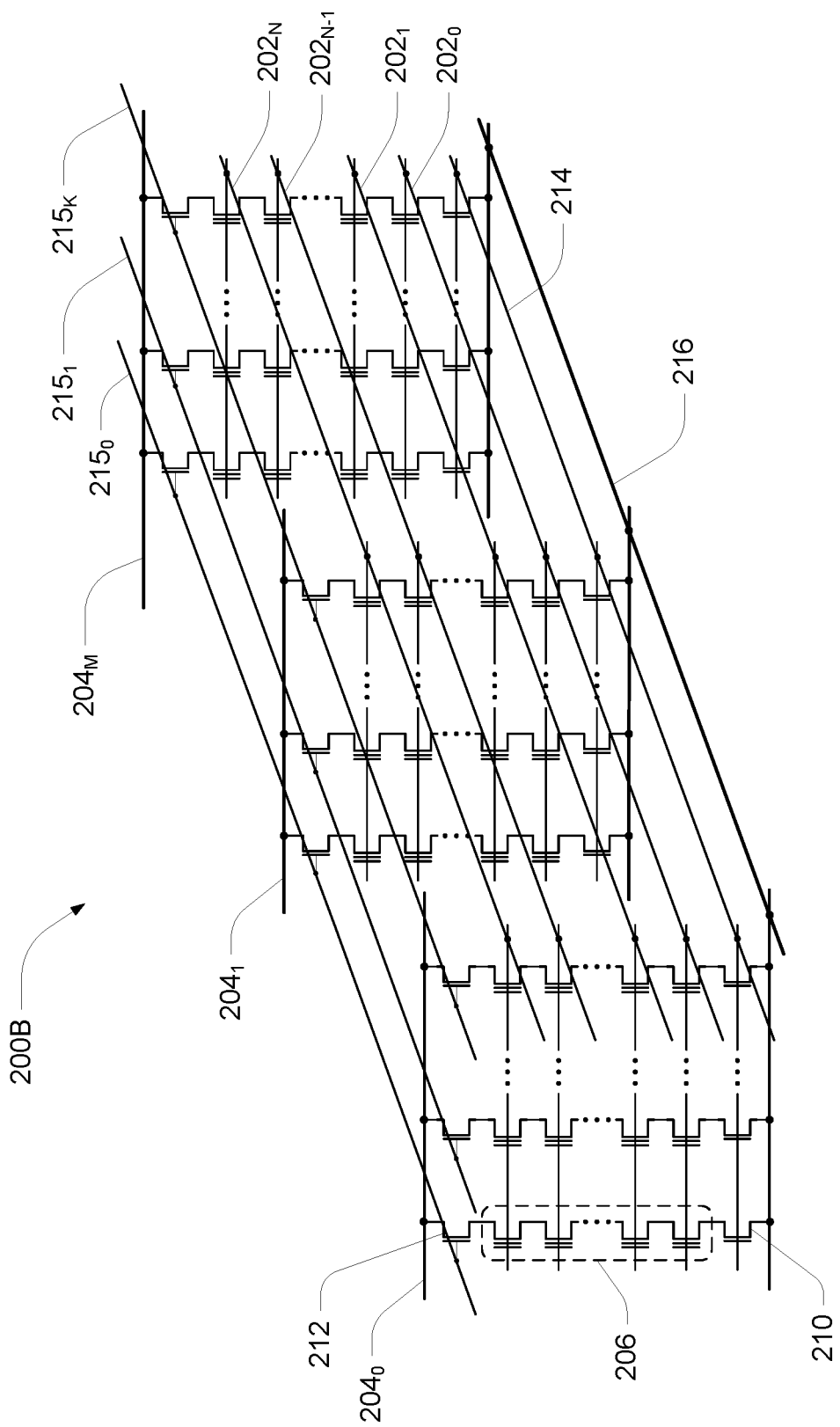

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
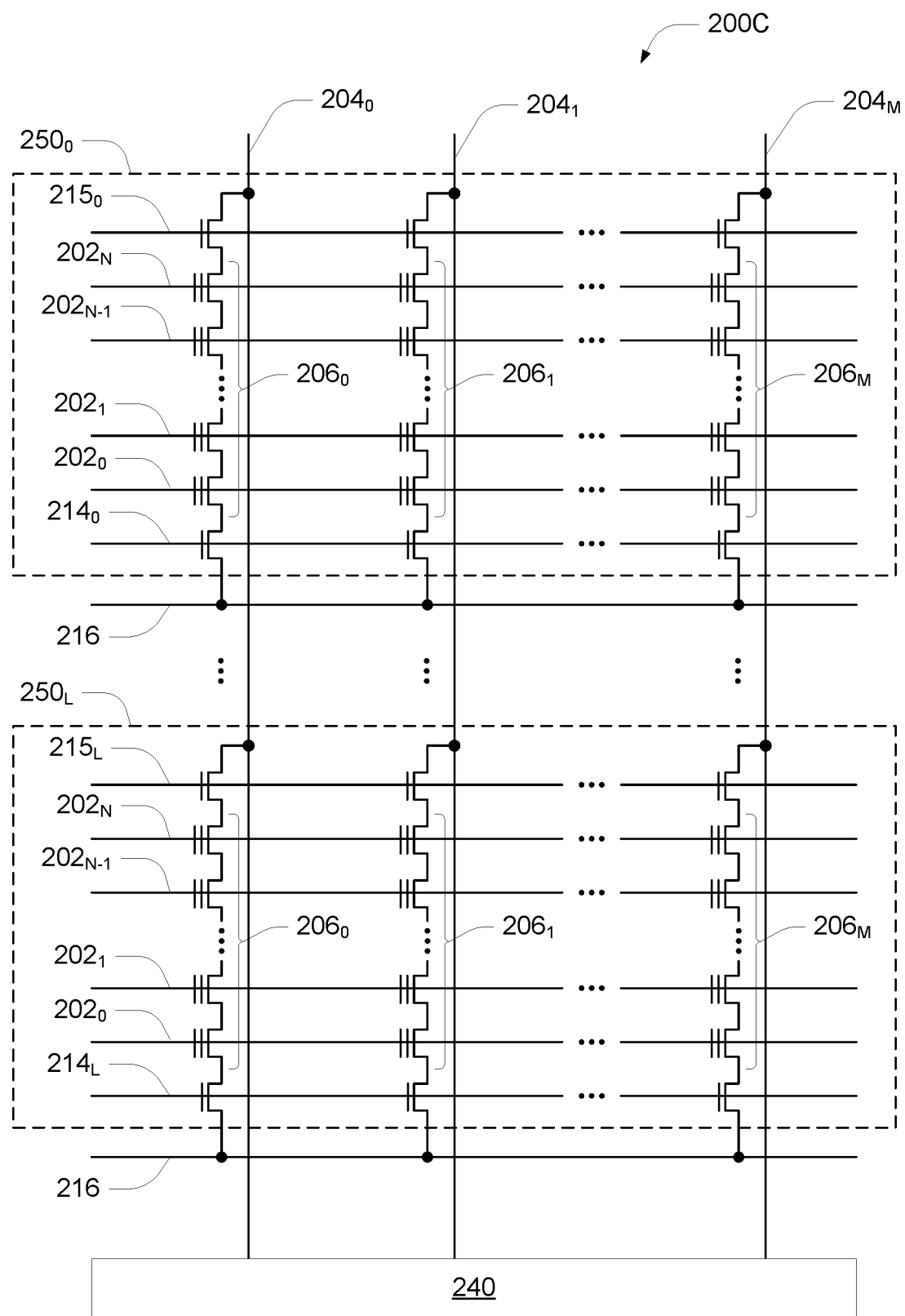

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

Figure 2D:
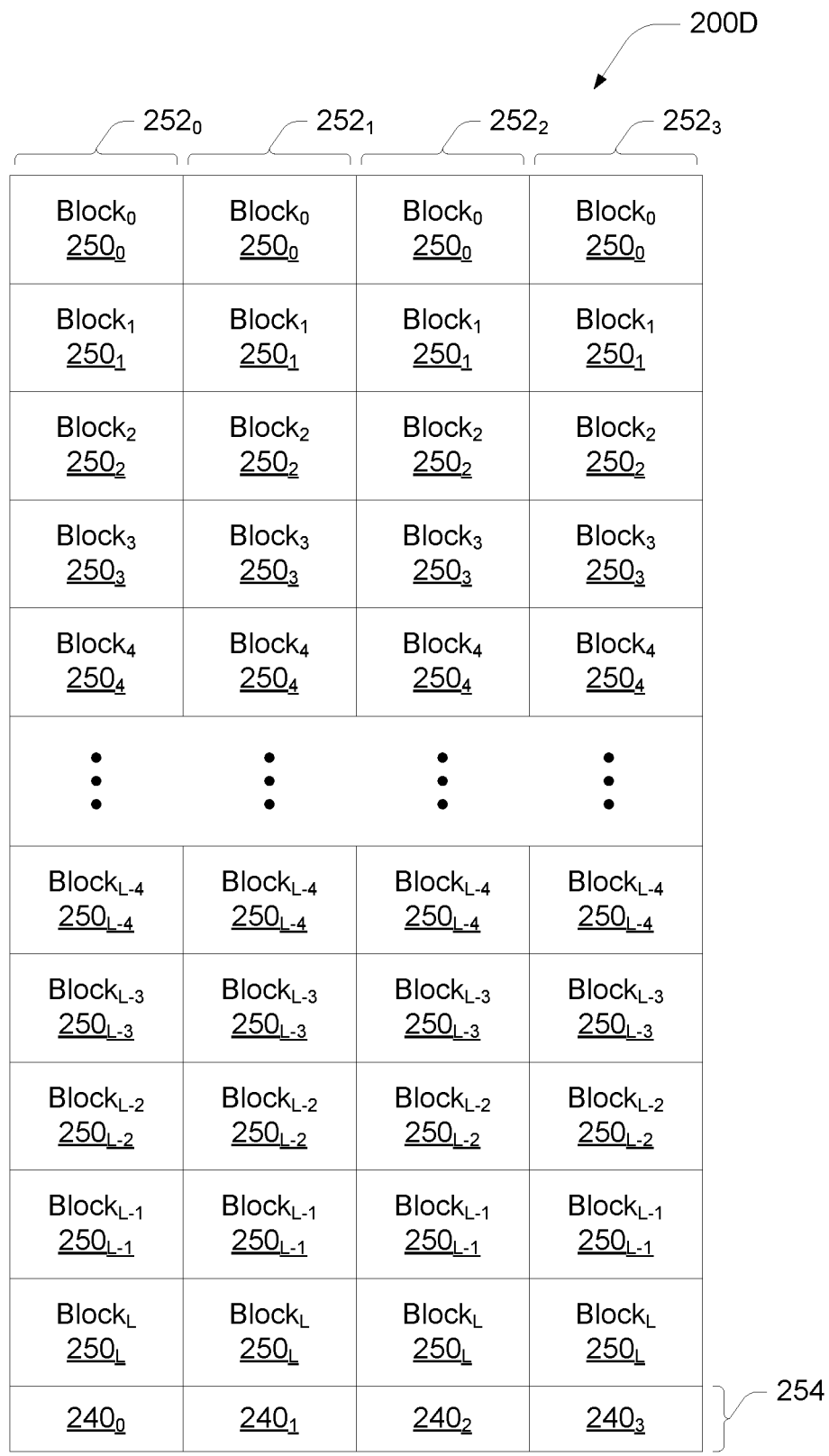

FIG. 2D is a block schematic of a portion of an array of memory cells as could be used in a memory of the type described with reference to FIG. 1. The array of memory cells 200D is depicted to have four memory planes 252 (e.g., memory planes $252_0$-$252_3$), each in communication with a respective buffer portion 240 (e.g., buffer portions $240_0$-$240_3$), which might collectively form a data buffer (e.g., page buffer) 254. While four memory planes 252 are depicted, other numbers of memory planes 252 might be commonly in communication with a data buffer 254. Each memory plane 252 is depicted to include L+1 blocks of memory cells 250 (e.g., blocks of memory cells $250_0$-$250_L$).

Figure 3:
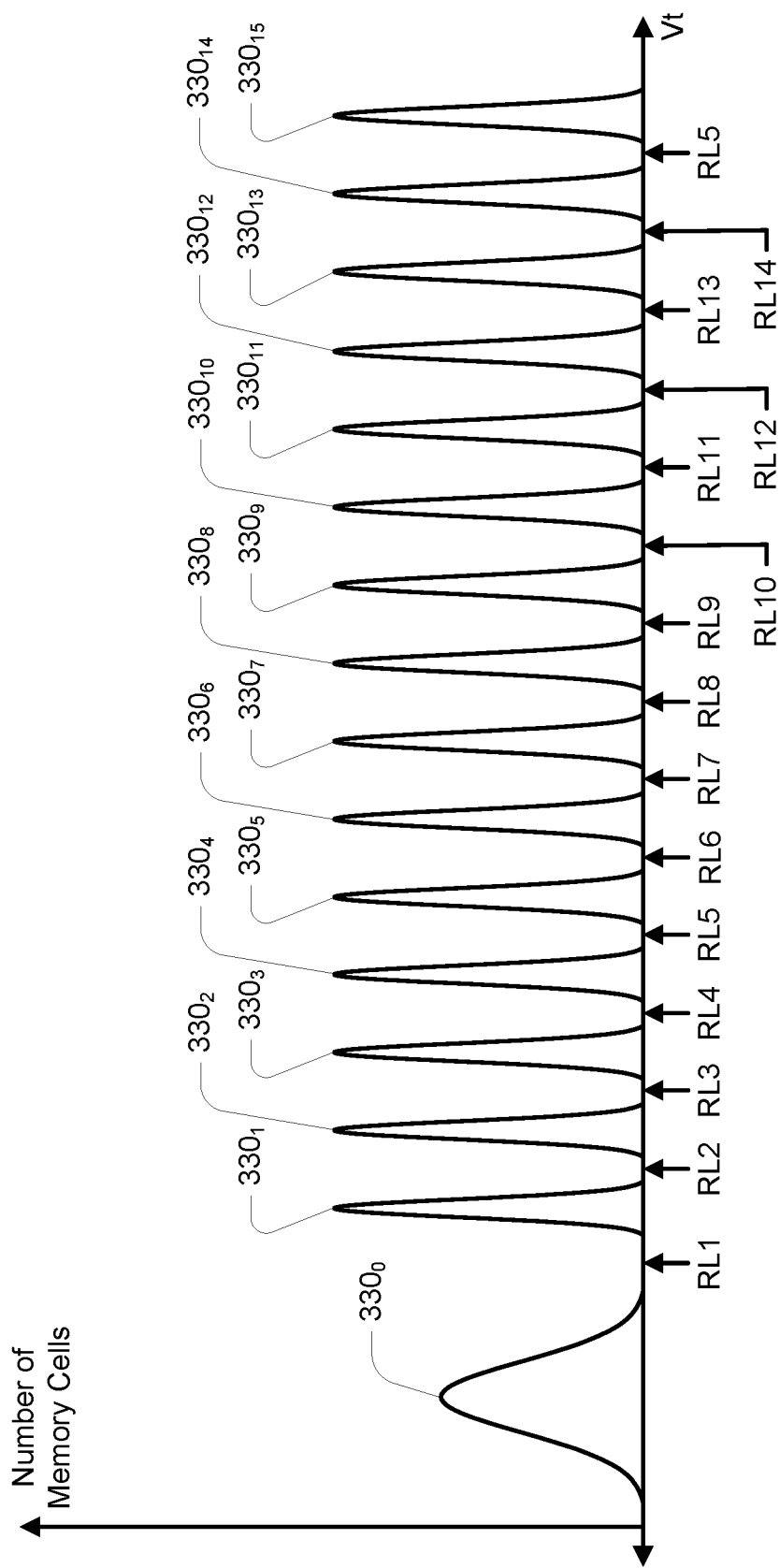
FIG. 3 is a conceptual depiction of threshold voltage distributions of a plurality of memory cells.

FIG. 3 is a conceptual depiction of threshold voltage distributions of a plurality of memory cells. FIG. 3 illustrates an example of threshold voltage distributions, and their threshold voltage ranges, for a population of a sixteen-level memory cells, often referred to as QLC memory cells. For example, such a memory cell might be programmed to a threshold voltage (Vt) that falls within the threshold voltage range of one of sixteen different threshold voltage distributions $330_0$-$330_{15}$, each being used to represent a data state corresponding to a bit pattern of four bits. The threshold voltage distribution $330_0$ typically has a greater width than the remaining threshold voltage distributions $330_1$-$330_{15}$ as memory cells are generally all placed in the data state corresponding to the threshold voltage distribution $330_0$, then subsets of those memory cells are subsequently programmed to have threshold voltages in the threshold voltage range of one of the threshold voltage distributions $330_1$-$330_{15}$. As programming operations are generally more incrementally controlled than erase operations, these threshold voltage distributions $330_1$-$330_{15}$ may tend to have tighter distributions.

The threshold voltage distributions $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$ and $330_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage distributions $330_0$, the memory cell in this case may be storing a data state L0 having a data value of logical '1111' and is typically referred to as the erased state of the memory cell. If the threshold voltage is within the second of the sixteen threshold voltage distributions $330_1$, the memory cell in this case may be storing a data state L1 having a data value of logical '0111'. If the threshold voltage is within the third of the sixteen threshold voltage distributions $330_2$, the memory cell in this case may be storing a data state L2 having a data value of logical '0011', and so on. Table 1 provides one possible correspondence between the data states and their corresponding logical data values. Other assignments of data states to logical data values are known. For QLC memory cells, the least significant digit (e.g., least significant bit) of the data state might be referred to as lower page (LP) data, the next significant digit of the data state might be referred to as upper page (UP) data, the next significant digit of the data state might be referred to as extra page (XP) data, and the most significant digit of the data state might be referred to as top page (TP) data. Memory cells remaining in the lowest data state (e.g., the erased state or L0 data state), as used herein, will be deemed to be programmed to the lowest data state.

TABLE 1

| Data State | Logical Data Value | | | |
|---|---|---|---|---|
| | TP | XP | UP | LP |
| L0 | 1 | 1 | 1 | 1 |
| L1 | 0 | 1 | 1 | 1 |
| L2 | 0 | 0 | 1 | 1 |
| L3 | 1 | 0 | 1 | 1 |
| L4 | 1 | 0 | 0 | 1 |
| L5 | 0 | 0 | 0 | 1 |
| L6 | 0 | 1 | 0 | 1 |

TABLE 1-continued

| Data State | Logical Data Value | | | |
|---|---|---|---|---|
| | TP | XP | UP | LP |
| L7 | 1 | 1 | 0 | 1 |
| L8 | 1 | 1 | 0 | 0 |
| L9 | 0 | 1 | 0 | 0 |
| L10 | 0 | 0 | 0 | 0 |
| L11 | 1 | 0 | 0 | 0 |
| L12 | 1 | 0 | 1 | 0 |
| L13 | 0 | 0 | 1 | 0 |
| L14 | 0 | 1 | 1 | 0 |
| L15 | 1 | 1 | 1 | 0 |

Determining the data states of the memory cells of the threshold voltage distributions $330_0$-$330_{15}$ might include applying sense voltages, e.g., read levels RL1-RL15, to the access line connected to the control gates of the memory cells of the threshold voltage distributions $330_0$-$330_{15}$, and sensing whether any of those memory cells were activated in response to any one of those sense voltages. In the example of FIG. 3 and Table 1, it can be seen that applying the read level RL8 might be used to determine whether the LP data is a logical 0 or a logical 1. Applying the read levels RL4 and RL12 in sequence might be used to determine whether the UP data is a logical 0 or a logical 1, with memory cells first activating in response to the read level RL4 and memory cells not activating in response to the read level RL12 having a logical 1 value, and with memory cells first activating in response to the read level RL12 having a logical 0 value. In like fashion, applying the read levels RL2, RL6, RL10 and RL14 in sequence can be used to determine the XP data, while applying the read levels RL1, RL3, RL5, RL7, RL9, RL11, RL13 and RL15 in sequence can be used to determine the TP data.

Figure 4:
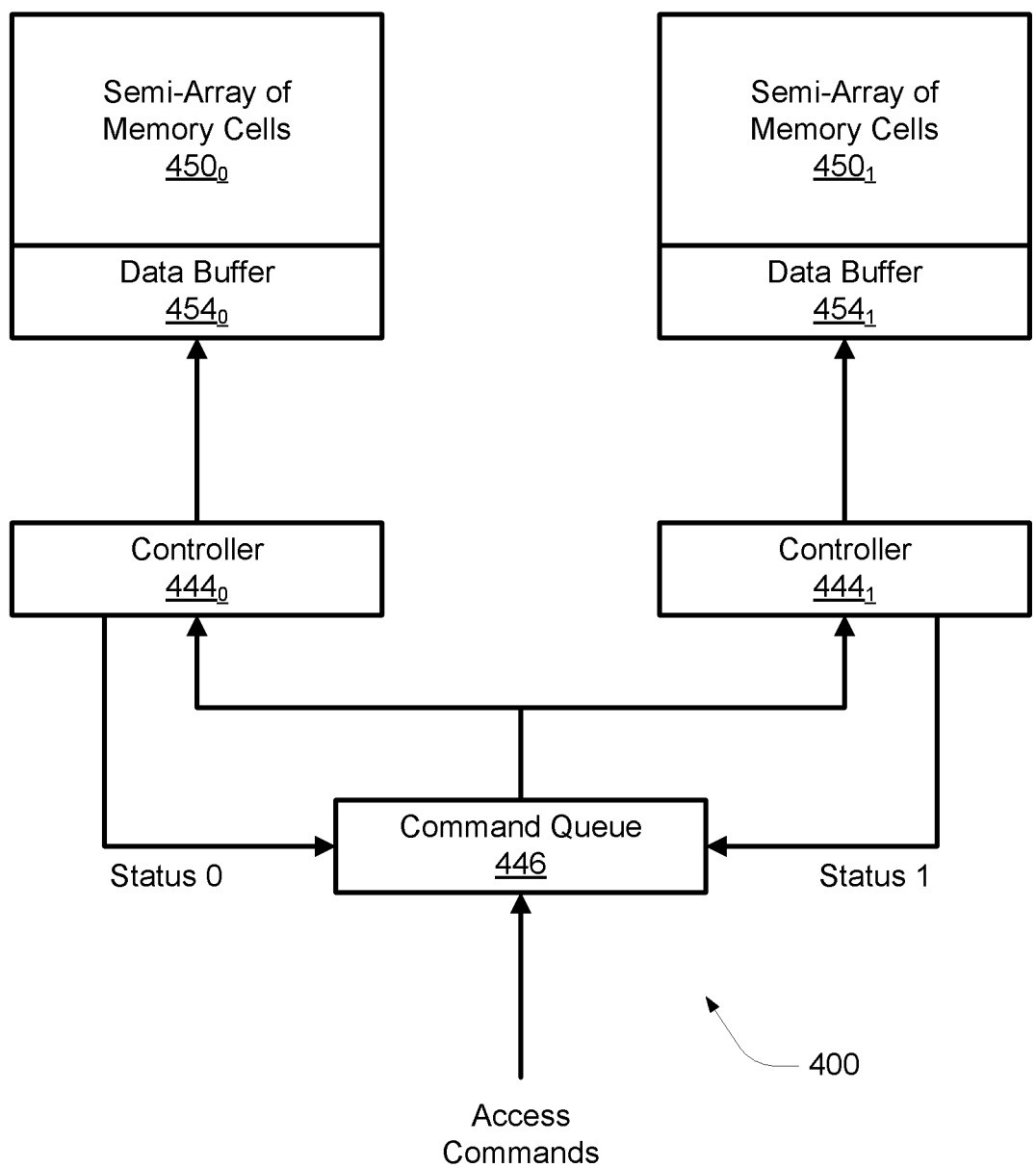
FIG. 4 is a block diagram of an apparatus configured for concurrent access of different groupings of memory cells in accordance with an embodiment.

FIG. 4 is a block diagram of an apparatus 400 configured for concurrent access of different groupings of memory cells in accordance with an embodiment. The apparatus 400 might include a first grouping of memory cells, e.g., semi-array of memory cells, $450_0$ and a second grouping of memory cells, e.g., semi-array of memory cells $450_1$. The semi-arrays of memory cells 450 might correspond to different memory planes of an array of memory cells, or different groupings of memory planes of an array of memory cells. In general, each semi-array of memory cells 450 might be some grouping of memory cells configured to be independently accessed, and configured to be concurrently accessed with the other semi-array(s) of memory cells 450 or other grouping of memory cells. To facilitate concurrent access, each semi-array of memory cells $450_0$ and $450_1$ might have a corresponding data buffer $454_0$ and $454_1$, respectively.

Each semi-array of memory cells/data buffer combination, e.g., semi-array of memory cells $450_0$/data buffer $454_0$ and semi-array of memory cells $450_1$/data buffer $454_1$, might be responsive to a corresponding controller $444_0$ and $444_1$, respectively. The controllers 444 might be distinct controllers, or they might represent different processing threads of a single controller. The controllers 444 might represent a portion of the control logic 116, for example.

The controllers $444_0$ and $444_1$ might be in communication with each other, and might further be in communication with a command queue 446. The command queue 446 might be configured to receive access commands and queue them, e.g., in a first-in-first-out (FIFO) fashion for each controller 444. For example, commands for access of the semi-array of memory cells $450_0$ might be queued for the controller $444_0$ in a FIFO fashion, and commands for access of the semi-array of memory cells $450_1$ might be queued for the controller $444_1$ in a FIFO fashion. However, a command for access of one semi-array of memory cells 450 might be provided to its respective controller 444 without regard to the order of receipt of commands for access of the other semi-array of memory cells 450. The command queue 446 might be responsive to respective status signals, e.g., Status 0 for controller $444_0$, and Status 1 for controller $444_1$. The status signals of the controllers 444 might indicate whether that controller 444 is ready to receive a command, e.g., is not busy performing a prior access operation, and whether it is ready to perform a next subsequent phase of a multi-phase access operation, as will be explained in more detail with reference to FIG. 6.

Figure 5:
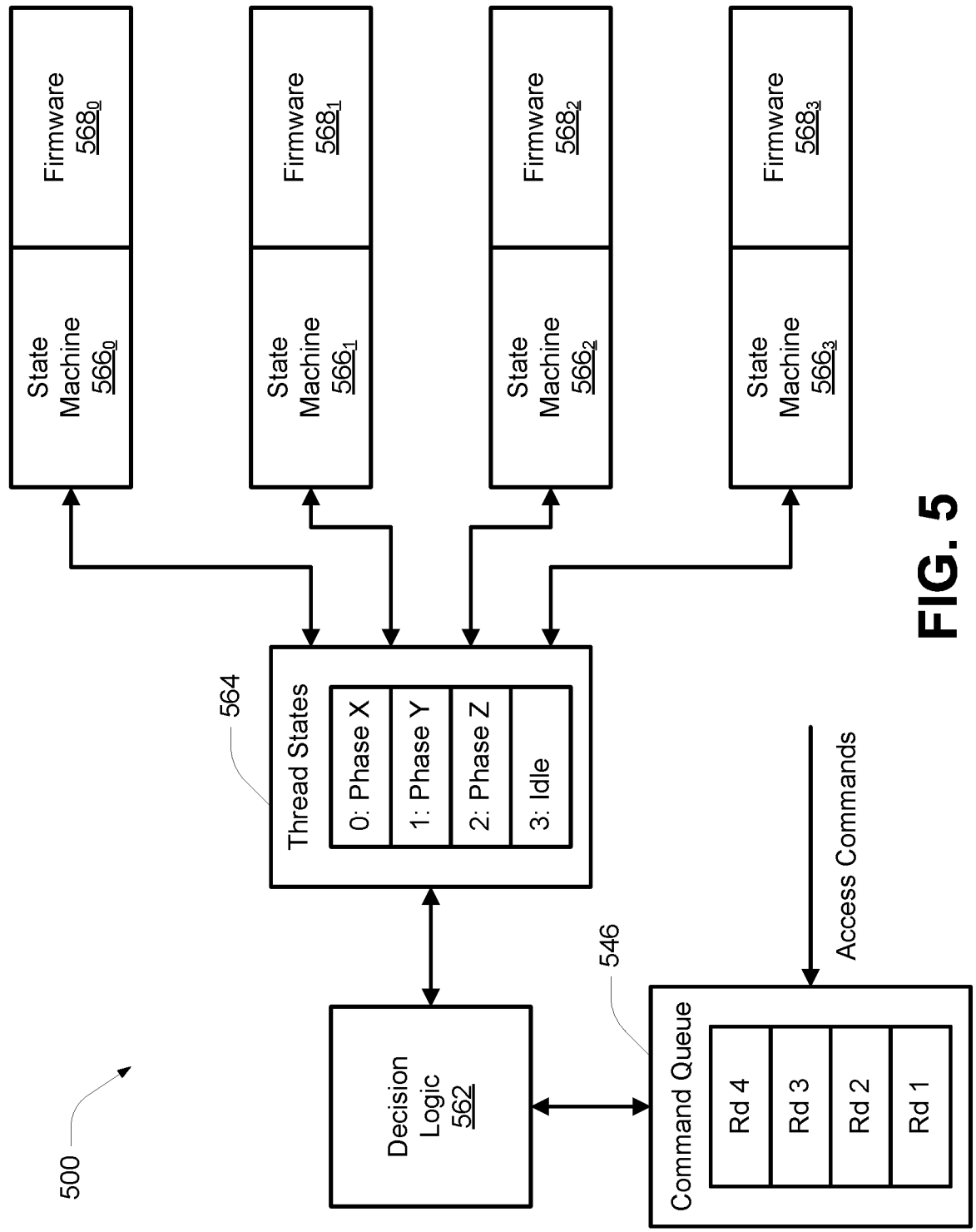
FIG. 5 is a block diagram of an apparatus configured for concurrent access of different groupings of memory cells in accordance with another embodiment.

FIG. 5 is a block diagram of an apparatus 500 configured for concurrent access of different groupings of memory cells in accordance with another embodiment. The apparatus 500 might include a number of state machines 566, e.g., state machines $566_0$-$566_3$. Each state machine $566_0$-$566_3$ might have corresponding firmware $568_0$-$568_3$, respectively. The firmware 568 might represent stored instructions for a respective state machine 566. A state machine 566 and its firmware 568 might correspond to a controller 444 of FIG. 4, for example. Each state machine 566 might be configured for access of a respective grouping of memory cells, e.g., a semi-array of memory cells 450 of FIG. 4.

The apparatus 500 might further include a thread state monitor 564. The thread state monitor 564 might contain information regarding a status of whether an access operation is being performed by a state machine 566, a current phase of any access operation being performed by a state machine 566, and a status of whether the state machine 566 is waiting to perform a next subsequent phase of that access operation.

The apparatus 500 might further include a command queue 546 configured to receive access commands and queue them for performance by state machines 566 according to the groupings of memory cells to be accessed. The apparatus 500 might further include decision logic 562. The decision logic 562, thread state monitor 564 and state machines 566 might be a portion of the control logic 116 of FIG. 1, for example. The decision logic 562 might be responsive to information from the thread state monitor 564 and from the command queue 546. For example, where the thread state of a particular state machine 566, e.g., state machine $566_3$, indicates that the state machine 566 is idle, the decision logic 562 might pass an access command corresponding to that state machine 566 from the command queue 546 to that state machine 566, and might update the thread state monitor 564 to indicate that that state machine 566 is ready to start performing the access operation corresponding to that access command.

Figure 6:
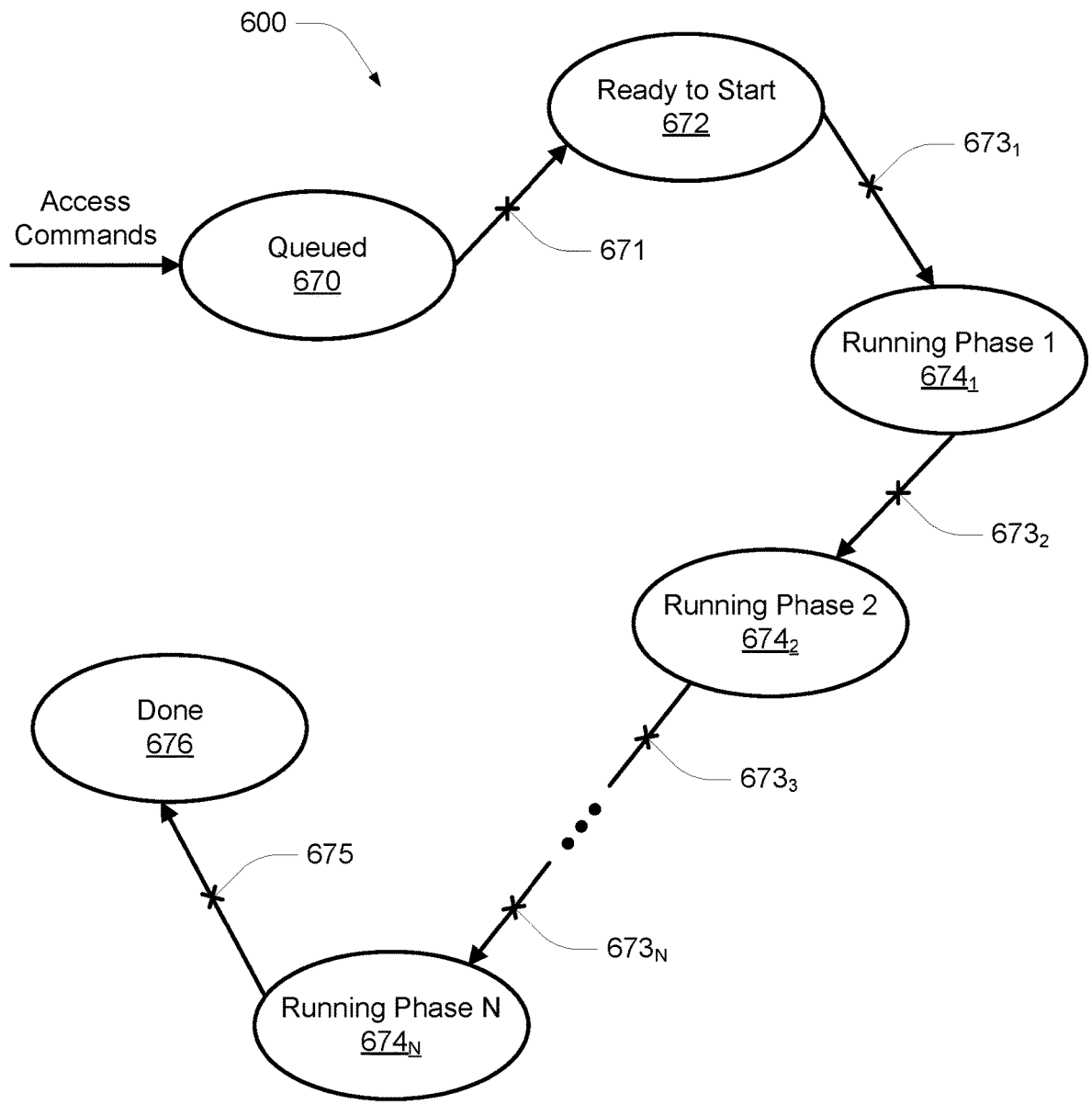
FIG. 6 is a state diagram of a multi-phase access operation in accordance with an embodiment.

FIG. 6 is a state diagram 600 of a multi-phase access operation in accordance with an embodiment. For example, the access operation might correspond to a sense operation, e.g., a read operation or a verify operation, to be performed on an addressed grouping of memory cells, e.g., a semi-array of memory cells. In operation, multiple state diagrams 600 might be active, e.g., where concurrent access operations are to be performed on multiple groupings of memory cells. The state diagrams 600 might represent processing of the control logic 116, e.g., an internal controller.

At 670, an access command for the access operation might be queued. The transition point 671 might be responsive to an indication that the corresponding controller is idle, at which point the state might advance to 672 and be ready to start performing the access operation, yet paused. The transition point $673_1$ might be responsive to an indication that each remaining controller is either idle or also paused. The state might then advance to $674_1$ to perform phase 1 of the access operation. For some embodiments, each remaining controller might remain paused during performance of phase 1 of the access operation. That is, each remaining controller might be prohibited from proceeding to the next subsequent phase of their respective access operations. Each remaining transition point $673_2$-$673_N$ might be responsive to indications that the controller has completed its current phase of the access operation, and each remaining controller is either idle or paused, in order to advance to the each next subsequent phase (e.g., states $674_2$-$674_N$) of the access operation. Where the condition is not satisfied, the controller performing the access operation might also be paused after completion of a corresponding phase of the access operation. The transition point 675 might be responsive only to an indication that phase N of the access operation, e.g., a last phase of the access operation, is complete, at which point the state might advance to 676, which might generate an indication that the controller is idle. The transition point 675 might advance without reference to the states of any remaining controller.

In general, when a thread, e.g., for performance of an access operation, completes a phase of the access operation, it might open a synchronization period and pause for the conditions of the next transition point 673 to be satisfied. During the synchronization period, remaining threads for access of other groupings of memory cells might move toward completion of current phases of their corresponding access operations. As each of these remaining threads performing access operations completes their current phase, they might also pause for the conditions of their next transition point 673 to be satisfied. When the last thread completes its current phase, the synchronization period might be closed, and each thread might advance to perform respective next subsequent phases of their access operations, or a thread might advance from ready to start and perform its first phase, while remaining threads remain paused.

Figure 7:
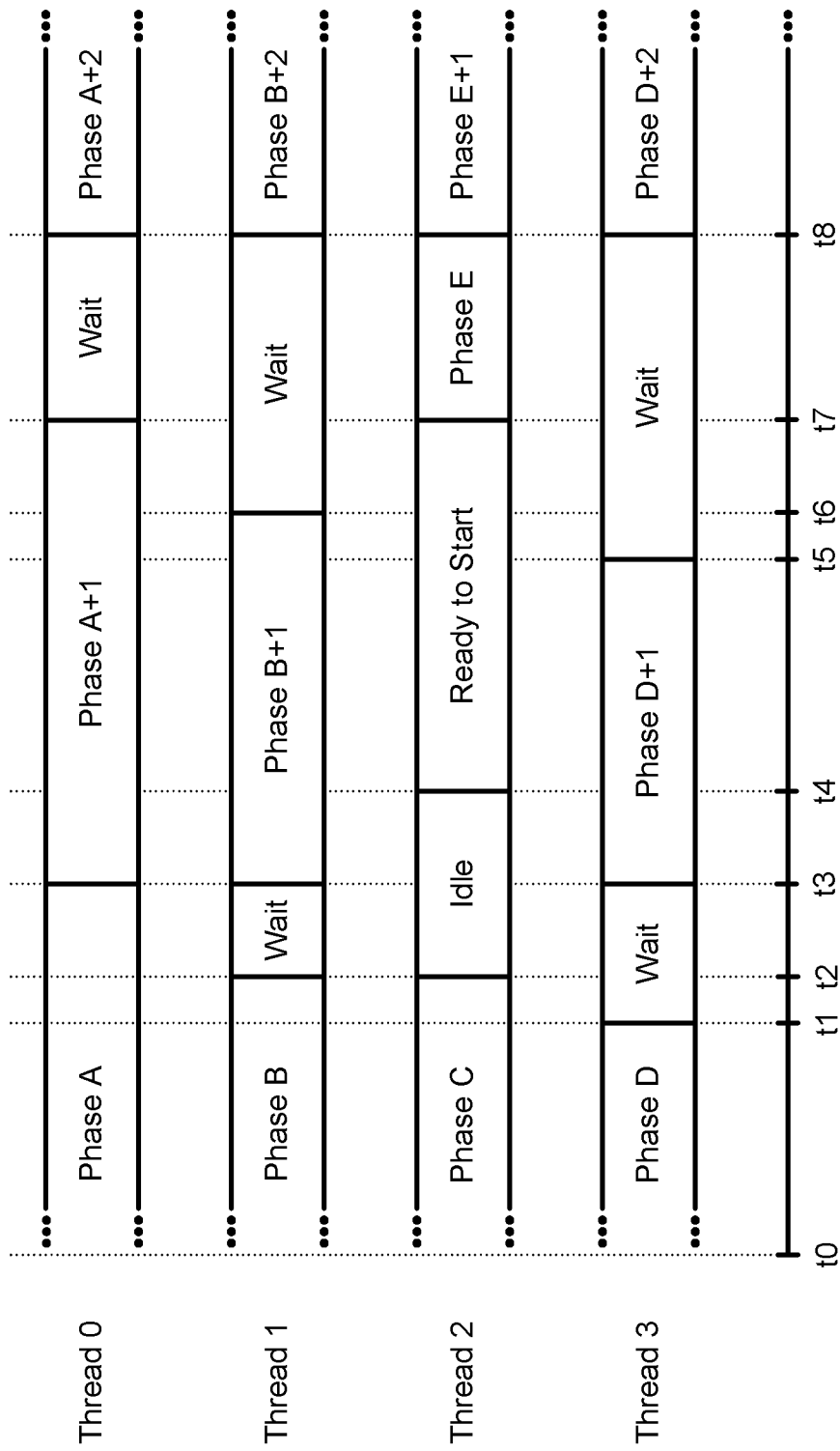
FIG. 7 is a timing diagram generally depicting concurrent performance of phases of a plurality of access operations in accordance with an embodiment.

FIG. 7 is a timing diagram generally depicting concurrent performance of phases of a plurality of access operations in accordance with an embodiment. The timing diagram of FIG. 7 might correspond to performance of concurrent access operations by four controllers according to the state diagram 600 of FIG. 6. It is noted that the concurrent access operation need not be the same access operation. It is further noted that even where two concurrent access operations are the same access operation, they need not be performing the same phase concurrently.

At time t0, Thread 0 might be performing Phase A of its corresponding access operation, Thread 1 might be performing Phase B of its corresponding access operation, Thread 2 might be performing Phase C of its corresponding access operation, and Thread 3 might be performing Phase D of its corresponding access operation. At time t1, Thread 3 might complete its Phase D and open a synchronization period as well as enter a wait state, e.g., paused. The opening of a synchronization period might be indicated by a particular value of a register or control signal shared by the different threads. At time t2, Thread 1 might complete its Phase B and enter a wait state, e.g., paused. Also at time t2, Thread 2 might complete its Phase C and enter an idle state.

At time t3, Thread 0 might complete its Phase A and close the synchronization period. The closing of a synchronization period might be indicated by a different value of a register or control signal shared by the different threads. As a result of the closing of the synchronization period, Thread 0 might advance to perform the next subsequent phase, e.g., Phase A+1, of its access operation, Thread 1 might advance to perform the next subsequent phase, e.g., Phase B+1, of its access operation, and Thread 3 might advance to perform the next subsequent phase, e.g., Phase D+1, of its access operation. Thread 2 might remain idle if no access command is received.

At time t4, an access command, e.g., for a new access operation, might be received, and Thread 2 might enter a ready-to-start state, maintaining its controller in a paused state. At time t5, Thread 3 might complete its Phase D+1 and start a synchronization period as well as enter a wait state, e.g., paused. At time t6, Thread 1 might complete its Phase B+1 and enter a wait state, e.g., paused.

At time t7, Thread 0 might complete its Phase A+1 and close the synchronization period. As Thread 2 is in a ready-to-start state, it might advance to perform the first phase of its new access operation, e.g., Phase E, while remaining threads, e.g., Thread 0, Thread 1 and Thread 3, remain paused. At time t8, Thread 2 might complete its Phase E. As a result, Thread 0 might advance to perform the next subsequent phase, e.g., Phase A+2, of its access operation, Thread 1 might advance to perform the next subsequent phase, e.g., Phase B+2, of its access operation, Thread 2 might advance to perform the next subsequent phase, e.g., Phase E+1, of its access operation, and Thread 3 might advance to perform the next subsequent phase, e.g., Phase D+2, of its access operation.

FIGS. 8A-8D are timing diagrams of a plurality of different access operations having differing numbers of phases for use with embodiments. The timing diagrams of FIGS. 8A-8D might correspond to various sense operations of a QLC memory that could be used to determine data values of a logical page of memory cells. For example, FIG. 8A might correspond to a sense operation to determine LP data of a page of memory cells, FIG. 8B might correspond to a sense operation to determine UP data of a page of memory cells, FIG. 8C might correspond to a sense operation to determine XP data of a page of memory cells, and FIG. 8D might correspond to a sense operation to determine TP data of a page of memory cells, as discussed with reference to Table 1 and FIG. 3. Traces 882, e.g., trace 882$_{LP}$, 882$_{UP}$, 882$_{XP}$, and 882$_{TP}$, might correspond to voltage levels of unselected access lines 202 of a sense operation. Traces 880, e.g., trace 880$_{LP}$, 880$_{UP}$, 880$_{XP}$, and 880$_{TP}$, might correspond to voltage levels of unselected access lines 202 of a sense operation.

With reference to FIG. 8A, at time t0, a precharge phase might begin. The precharge phase of the sense operation brings the voltage level 882$_{LP}$ of the unselected access lines to a voltage level sufficient to activate their respective connected memory cells regardless of their data states, e.g., a pass voltage. The voltage level 880$_{LP}$ of the selected access line might initially be increased along with the voltage levels 882$_{LP}$ of the unselected access lines. Bringing all of the access lines up together in this manner may facilitate improvements in speed to steady state of the unselected access lines.

At or around time t1, the voltage level 880$_{LP}$ of the selected access line 202$_x$ might be discharged, and at time t2, the voltage level 880$_{LP}$ might approach a voltage level corresponding to read level RL8. The time period from time t0 to time t2 might correspond to an initial phase of the sense operation of FIG. 8A. Sensing to determine the LP data value(s) of the target memory cell(s) might occur between times t2 and t3, and may occur at or near time t3. At time t3, e.g., after sensing, the access operation of FIG. 8A might be complete, and the voltage levels 880$_{LP}$ and 882$_{LP}$ might be discharged.

With reference to FIG. 8B, at time t0, a precharge phase might begin. The precharge phase of the sense operation brings the voltage level 882$_{UP}$ of the unselected access lines to a voltage level sufficient to activate their respective connected memory cells regardless of their data states, e.g., a pass voltage. The voltage level 880$_{UP}$ of the selected access line might initially be increased along with the voltage levels 882$_{UP}$ of the unselected access lines.

At or around time t1, the voltage level 880$_{UP}$ of the selected access line 202$_x$ might be discharged, and at time t2, the voltage level 880$_{UP}$ might approach a voltage level corresponding to read level RL4. The time period from time t0 to time t2 might correspond to an initial phase of the sense operation of FIG. 8B. Sensing to determine a portion of the UP data value(s) of the target memory cell(s) might occur between times t2 and t3, and may occur at or near time t3. The time period from time t2 to time t3 might correspond to a second phase of the sense operation of FIG. 8B, e.g., a next subsequent phase to the initial phase.

At time t3, e.g., after sensing, the voltage level 880$_{UP}$ might be increased to a voltage level corresponding to the read level RL12. Sensing to determine a remaining portion of the UP data value(s) of the target memory cell(s) might occur between times t3 and t4, and may occur at or near time t4. The time period from time t3 to time t4 might correspond to a third phase of the sense operation of FIG. 8B, e.g., a next subsequent phase to the second phase. At time t4, e.g., after sensing, the access operation of FIG. 8B might be complete, and the voltage levels 880$_{UP}$ and 882$_{UP}$ might be discharged.

With reference to FIG. 8C, at time t0, a precharge phase might begin. The precharge phase of the sense operation brings the voltage level 882$_{XP}$ of the unselected access lines to a voltage level sufficient to activate their respective connected memory cells regardless of their data states, e.g., a pass voltage. The voltage level 880$_{XP}$ of the selected access line might initially be increased along with the voltage levels 882$_{XP}$ of the unselected access lines.

At or around time t1, the voltage level 880$_{XP}$ of the selected access line 202$_x$ might be discharged, and at time t2, the voltage level 880$_{XP}$ might approach a voltage level corresponding to read level RL2. The time period from time t0 to time t2 might correspond to an initial phase of the sense operation of FIG. 8C. Sensing to determine a portion of the XP data value(s) of the target memory cell(s) might occur between times t2 and t3, and may occur at or near time t3. The time period from time t2 to time t3 might correspond to a second phase of the sense operation of FIG. 8C, e.g., a next subsequent phase to the initial phase.

At time t3, e.g., after sensing, the voltage level 880$_{XP}$ might be increased to a voltage level corresponding to the read level RL6. Sensing to determine an additional portion of the XP data value(s) of the target memory cell(s) might occur between times t3 and t4, and may occur at or near time t4. The time period from time t3 to time t4 might correspond to a third phase of the sense operation of FIG. 8C, e.g., a next subsequent phase to the second phase.

At time t4, e.g., after sensing, the voltage level 880$_{XP}$ might be increased to a voltage level corresponding to the read level RL10. Sensing to determine an additional portion of the XP data value(s) of the target memory cell(s) might occur between times t4 and t5, and may occur at or near time t5. The time period from time t4 to time t5 might correspond to a fourth phase of the sense operation of FIG. 8C, e.g., a next subsequent phase to the third phase.

At time t5, e.g., after sensing, the voltage level $880_{XP}$ might be increased to a voltage level corresponding to the read level RL14. Sensing to determine a remaining portion of the XP data value(s) of the target memory cell(s) might occur between times t5 and t6, and may occur at or near time t6. The time period from time t5 to time t6 might correspond to a fifth phase of the sense operation of FIG. 8C, e.g., a next subsequent phase to the fourth phase. At time t6, e.g., after sensing, the access operation of FIG. 8C might be complete, and the voltage levels $880_{XP}$ and $882_{XP}$ might be discharged.

With reference to FIG. 8D, at time t0, a precharge phase might begin. The precharge phase of the sense operation brings the voltage level $882_{TP}$ of the unselected access lines to a voltage level sufficient to activate their respective connected memory cells regardless of their data states, e.g., a pass voltage. The voltage level $880_{TP}$ of the selected access line might initially be increased along with the voltage levels $882_{TP}$ of the unselected access lines.

At or around time t1, the voltage level $880_{TP}$ of the selected access line $202_x$ might be discharged, and at time t2, the voltage level $880_{TP}$ might approach a voltage level corresponding to read level RL1. The time period from time t0 to time t2 might correspond to an initial phase of the sense operation of FIG. 8D. Sensing to determine a portion of the TP data value(s) of the target memory cell(s) might occur between times t2 and t3, and may occur at or near time t3. The time period from time t2 to time t3 might correspond to a second phase of the sense operation of FIG. 8D, e.g., a next subsequent phase to the initial phase.

At time t3, e.g., after sensing, the voltage level $880_{TP}$ might be increased to a voltage level corresponding to the read level RL3. Sensing to determine an additional portion of the TP data value(s) of the target memory cell(s) might occur between times t3 and t4, and may occur at or near time t4. The time period from time t3 to time t4 might correspond to a third phase of the sense operation of FIG. 8D, e.g., a next subsequent phase to the second phase.

At time t4, e.g., after sensing, the voltage level $880_{TP}$ might be increased to a voltage level corresponding to the read level RL5. Sensing to determine an additional portion of the TP data value(s) of the target memory cell(s) might occur between times t4 and t5, and may occur at or near time t5. The time period from time t4 to time t5 might correspond to a fourth phase of the sense operation of FIG. 8D, e.g., a next subsequent phase to the third phase.

At time t5, e.g., after sensing, the voltage level $880_{TP}$ might be increased to a voltage level corresponding to the read level RL7. Sensing to determine an additional portion of the TP data value(s) of the target memory cell(s) might occur between times t5 and t6, and may occur at or near time t6. The time period from time t5 to time t6 might correspond to a fifth phase of the sense operation of FIG. 8D, e.g., a next subsequent phase to the fourth phase.

At time t6, e.g., after sensing, the voltage level $880_{TP}$ might be increased to a voltage level corresponding to the read level RL9. Sensing to determine an additional portion of the TP data value(s) of the target memory cell(s) might occur between times t6 and t7, and may occur at or near time t7. The time period from time t6 to time t7 might correspond to a sixth phase of the sense operation of FIG. 8D, e.g., a next subsequent phase to the fifth phase.

At time t7, e.g., after sensing, the voltage level $880_{TP}$ might be increased to a voltage level corresponding to the read level RL11. Sensing to determine an additional portion of the TP data value(s) of the target memory cell(s) might occur between times t7 and t8, and may occur at or near time t8. The time period from time t7 to time t8 might correspond to a seventh phase of the sense operation of FIG. 8D, e.g., a next subsequent phase to the sixth phase.

At time t8, e.g., after sensing, the voltage level $880_{TP}$ might be increased to a voltage level corresponding to the read level RL13. Sensing to determine an additional portion of the TP data value(s) of the target memory cell(s) might occur between times t8 and t9, and may occur at or near time t9. The time period from time t8 to time t9 might correspond to an eighth phase of the sense operation of FIG. 8D, e.g., a next subsequent phase to the seventh phase.

At time t9, e.g., after sensing, the voltage level $880_{TP}$ might be increased to a voltage level corresponding to the read level RL15. Sensing to determine a remaining portion of the TP data value(s) of the target memory cell(s) might occur between times t9 and t10, and may occur at or near time t10. The time period from time t9 to time t10 might correspond to a ninth phase of the sense operation of FIG. 8D, e.g., a next subsequent phase to the eighth phase. At time t10, e.g., after sensing, the access operation of FIG. 8D might be complete, and the voltage levels $880_{TP}$ and $882_{TP}$ might be discharged.

Due to the generally large current draw of the precharge portions of the access operations of FIGS. 8A-8D, it may be advantageous to avoid sensing of one grouping of memory cells while another grouping of memory cells is performing the precharge phase of its access operation. Similarly, it may be advantageous to align the remaining phases of the various access operations such that the voltage levels of the access operations are each substantially at steady-state conditions for sensing. This might be accomplished by waiting until each access operation is ready to advance to the next phase, and concurrently initiating performance of the respective next phases.

Figure 9:
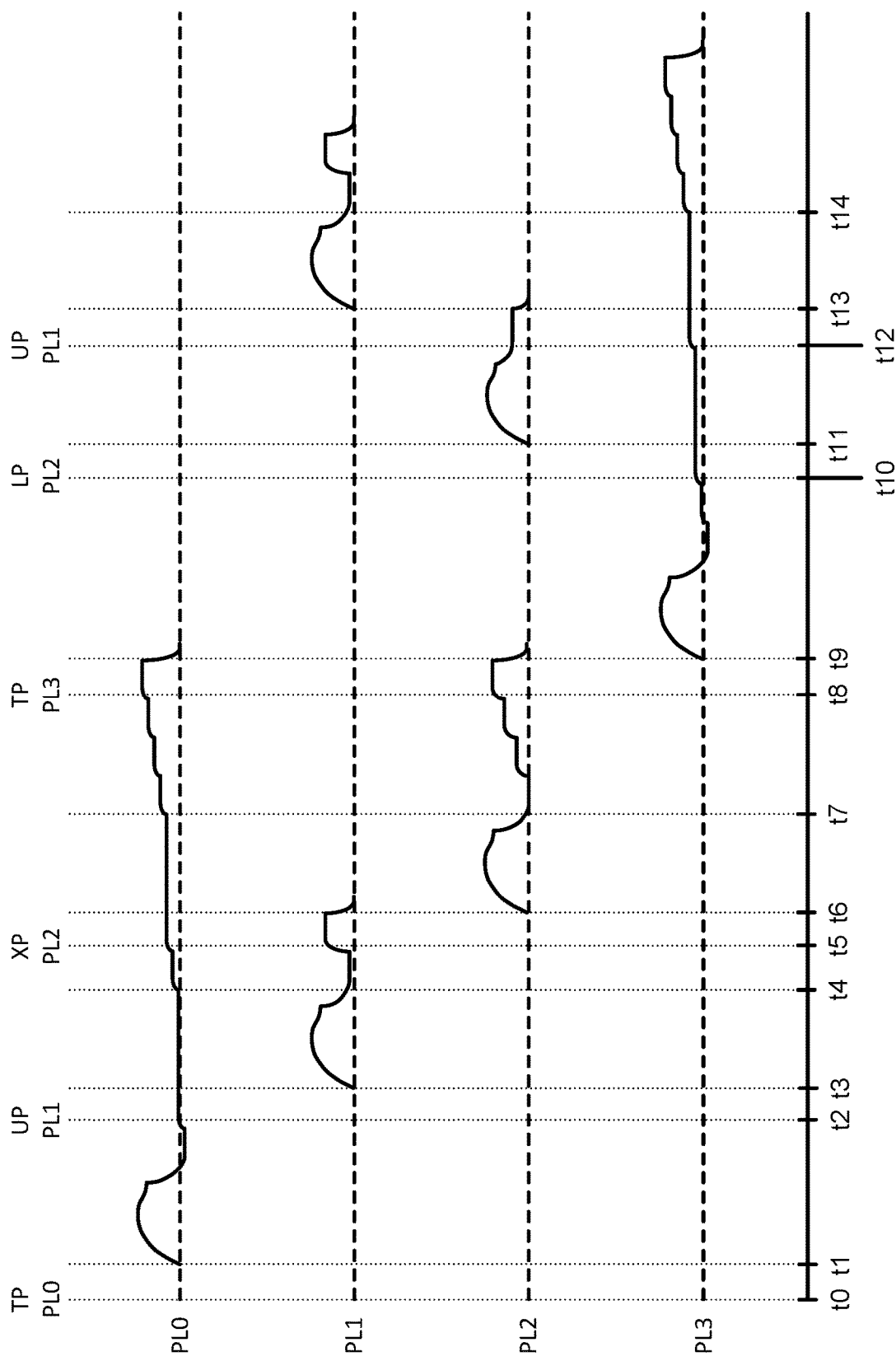
FIG. 9 is a timing diagram generally depicting concurrent performance of phases of the plurality of access operations of FIGS. 8A-8D in accordance with an embodiment.

FIG. 9 is a timing diagram generally depicting concurrent performance of phases of the plurality of access operations of FIGS. 8A-8D, for example, in accordance with an embodiment. The timing diagram might correspond to concurrent sense operations on four groupings of memory cells (e.g., memory planes or memory plane groups) PL0, PL1, PL2 and PL3. For clarity, the voltage levels of the unselected access lines are not depicted in FIG. 9.

At time t0, a first access command to perform a sense operation to determine TP data values of a logical page (e.g., FIG. 8D) of the first grouping of memory cells PL0 might be received. As no other access operations are active, the sense operation might begin at time t1. At time t2, during performance of the third phase of the sense operation on PL0, a second access command to perform a sense operation to determine UP data of a logical page (e.g., FIG. 8B) of the second grouping of memory cells PL1 might be received. Because the third phase of the sense operation on PL0 is active, the second access command might be indicated as ready to start.

At time t3, in response to completion of the third phase of the sense operation on PL0, the sense operation on PL0 might be paused, and the voltage level of the selected access line might remain at its voltage level corresponding to read level RL3 while the initial phase of the sense operation on PL1 is performed. For some embodiments, the selected access line might be electrically floating. At time t4, upon completion of the initial phase of the sense operation on PL1, the sense operation on PL1 might proceed to its second phase. Concurrently, the sense operation on PL0 might resume at its fourth phase.

At time t5, during performance of the fifth phase of the sense operation on PL0 and during performance of the third phase of the sense operation on PL1, a third access command to perform a sense operation to determine XP data values of a logical page (e.g., FIG. 8C) of the third grouping of memory cells PL2 might be received. Because the fifth phase of the sense operation on PL0 and the third phase of the sense operation on PL1 are active, the third access command might be indicated as ready to start.

At time t6, in response to completion of the fifth phase of the sense operation on PL0 and the completion of the sense operation on PL1, the sense operation on PL0 might be paused, and the voltage level of the selected access line might remain at its voltage level corresponding to read level RL7 while the initial phase of the sense operation on PL2 is performed. For some embodiments, the selected access line might be electrically floating. At time t7, upon completion of the initial phase of the sense operation on PL2, the sense operation on PL2 might proceed to its second phase. Concurrently, the sense operation on PL0 might resume at its sixth phase.

At time t8, during performance of the ninth phase of the sense operation on PL0 and during performance of the fifth phase of the sense operation on PL2, a fourth access command to perform a sense operation to determine TP data values of a logical page (e.g., FIG. 8D) of the fourth grouping of memory cells PL3 might be received. Because the ninth phase of the sense operation on PL0 and the fifth phase of the sense operation on PL2 are active, the fourth access command might be indicated as ready to start. At time t9, in response to completion of the sense operation on PL0 and the completion of the sense operation on PL2, the initial phase of the sense operation on PL3 might be performed.

At time t10, during performance of the fourth phase of the sense operation on PL3, a fifth access command to perform a sense operation to determine LP data values of a logical page (e.g., FIG. 8A) of the third grouping of memory cells PL2 might be received. Because the fourth phase of the sense operation on PL3 is active, the fifth access command might be indicated as ready to start.

At time t11, in response to completion of the fourth phase of the sense operation on PL3, the sense operation on PL3 might be paused, and the voltage level of the selected access line might remain at its voltage level corresponding to read level RL5 while the initial phase of the second sense operation on PL2 is performed. For some embodiments, the selected access line might be electrically floating. At time t12, upon completion of the initial phase of the second sense operation on PL2, the second sense operation on PL2 might proceed to its second phase. Concurrently, the sense operation on PL3 might resume at its fifth phase.

Also at or around time t12, after starting performance of the second phase of the second sense operation on PL2 and the fifth phase of the sense operation on PL3, a sixth access command to perform a sense operation to determine UP data values of a logical page (e.g., FIG. 8B) of the second grouping of memory cells PL1 might be received. Because the second phase of the second sense operation on PL2 and the fifth phase of the sense operation on PL3 are active, the sixth access command might be indicated as ready to start.

At time t13, in response to completion of the second sense operation on PL2 and completion of the fifth phase of the sense operation on PL3, the sense operation on PL3 might be paused, and the voltage level of the selected access line might remain at its voltage level corresponding to read level RL9 while the initial phase of the second sense operation on PL1 is performed. For some embodiments, the selected access line might be electrically floating. At time t14, upon completion of the initial phase of the second sense operation on PL1, the second sense operation on PL1 might proceed to its second phase. Concurrently, the sense operation on PL3 might resume at its sixth phase. Each of these sense operations might subsequently proceed to completion, e.g., waiting for each to complete a phase before both proceeding to a next subsequent phase.

Figure 10:
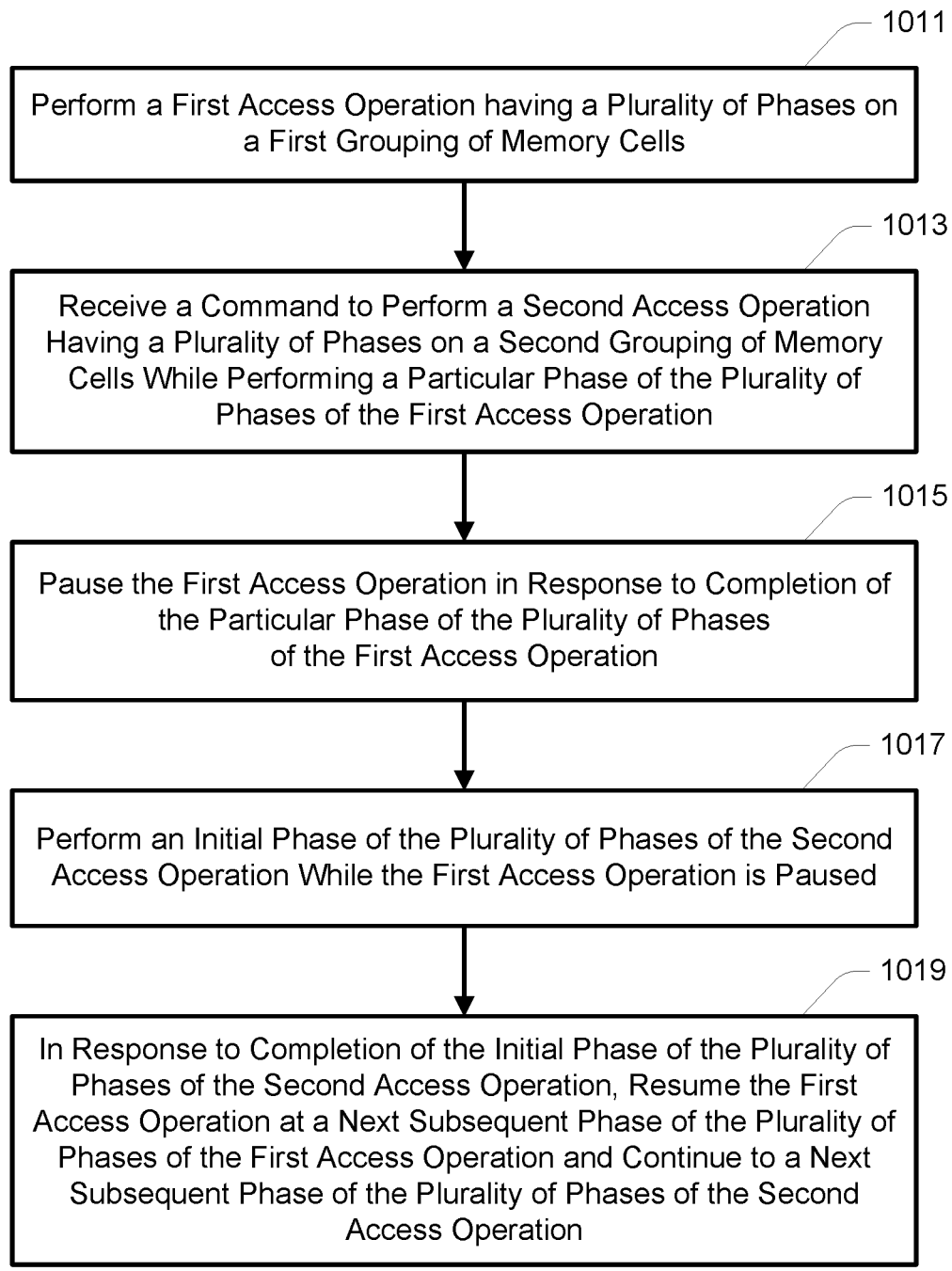
FIG. 10 is a flowchart of a method of operating a memory in accordance with an embodiment.

FIG. 10 is a flowchart of a method of operating a memory in accordance with an embodiment. For example, FIG. 10 might correspond to a method of performing two (or more) access operations concurrently on different groupings of memory cells.

At 1011, a first access operation having a plurality of phases might be performed on a first grouping of memory cells. For example, a first sense operation might be performed on a first memory plane or plane group of an array of memory cells. At 1013, a command to perform a second access operation having a plurality of phases on a second grouping of memory cells might be received while performing a particular phase of the plurality of phases of the first access operation. For example, a command to perform a second sense operation on a second memory plane or plane group of the array of memory cells might be received.

At 1015, the first access operation might be paused in response to completion of the particular phase of the plurality of phases of the first access operation. At 1017, an initial phase of the plurality of phases of the second access operation might be performed while the first access operation is paused. At 1019, in response to completion of the initial phase of the plurality of phases of the second access operation, the first access operation might be resumed at a next subsequent phase of the plurality of phases of the first access operation, and the second access operation might continue to a next subsequent phase (e.g., second phase) of the plurality of phases of the second access operation. These actions might be initiated substantially simultaneously. The respective phases might be performed concurrently.

Figure 11:
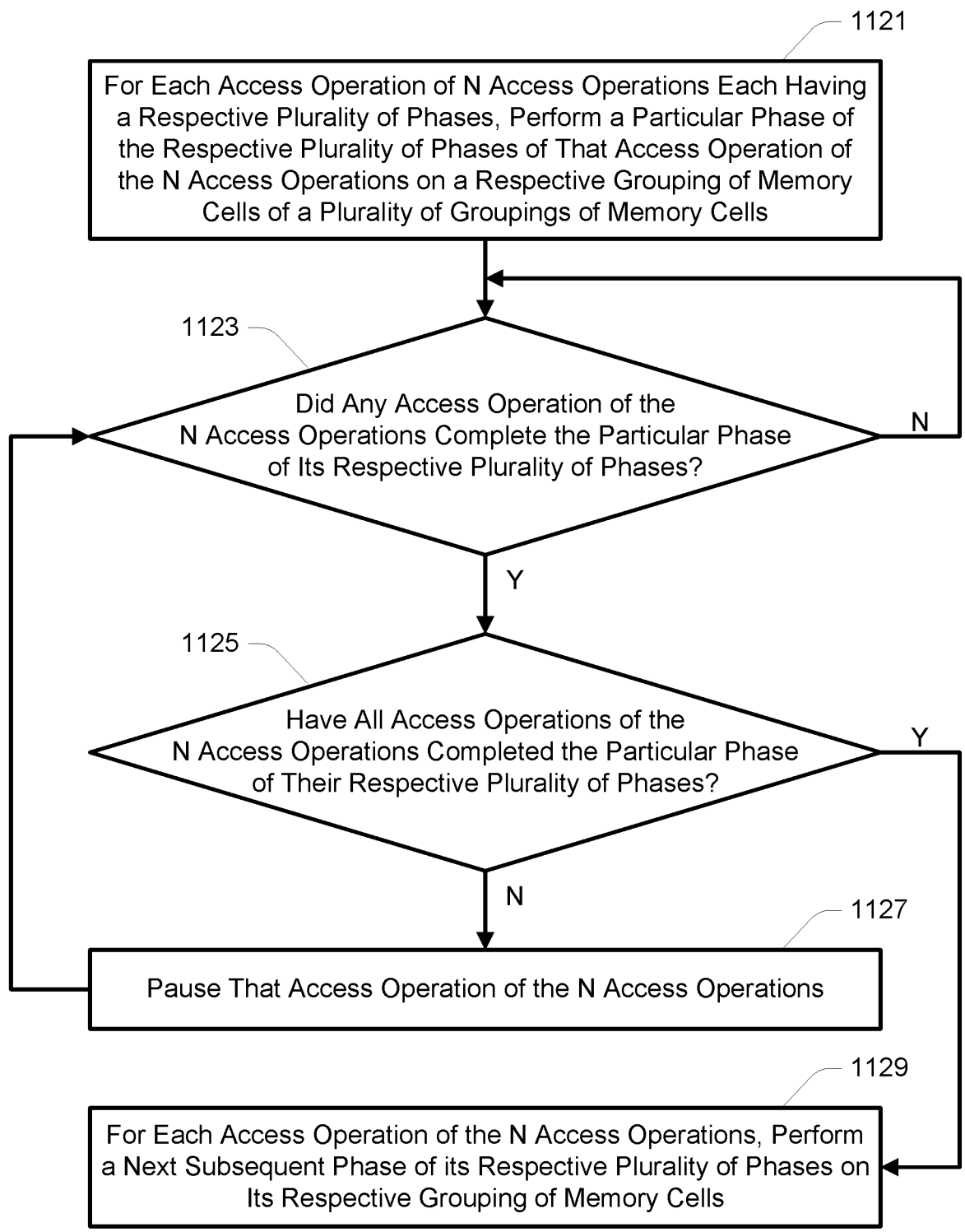
FIG. 11 is a flowchart of a method of operating a memory in accordance with another embodiment.

FIG. 11 is a flowchart of a method of operating a memory in accordance with another embodiment. For example, FIG. 11 might correspond to a method of performing two (or more) access operations concurrently on different groupings of memory cells.

At 1121, for each access operation of N access operations, each having a respective plurality of phases, a particular phase of the respective plurality of phases of that access operation of the N access operations might be performed on a respective grouping of memory cells of a plurality of groupings of memory cells. N might be an integer value greater than or equal to two. The respective particular phases of the N access operations might be performed concurrently.

At 1123, it might be determined whether any access operation of the N access operation completed the particular phase of its respective plurality of phases. If no, the process might return to 1123. If yes, the process might proceed to 1125. At 1125, it might be determined whether all access operations of the N access operation completed the particular phase of their respective plurality of phases. If no, the process might proceed to 1127 where the access operation completing the particular phase of its respective plurality of phases might be paused. If yes, the process might proceed to 1129 where, for each access operation of the N access operations, a next subsequent phase of its respective plurality of phases might be performed on its respective grouping of memory cells.

For some embodiments, a phase of an (N+1)th access operation on an additional grouping of memory cells of the plurality of groupings of memory cells might be performed, e.g., concurrently, with performing the respective particular phases of the N access operations at 1121. At 1123, the (N+1)th access operation might be determined to have completed that access operation.

Figure 12A:
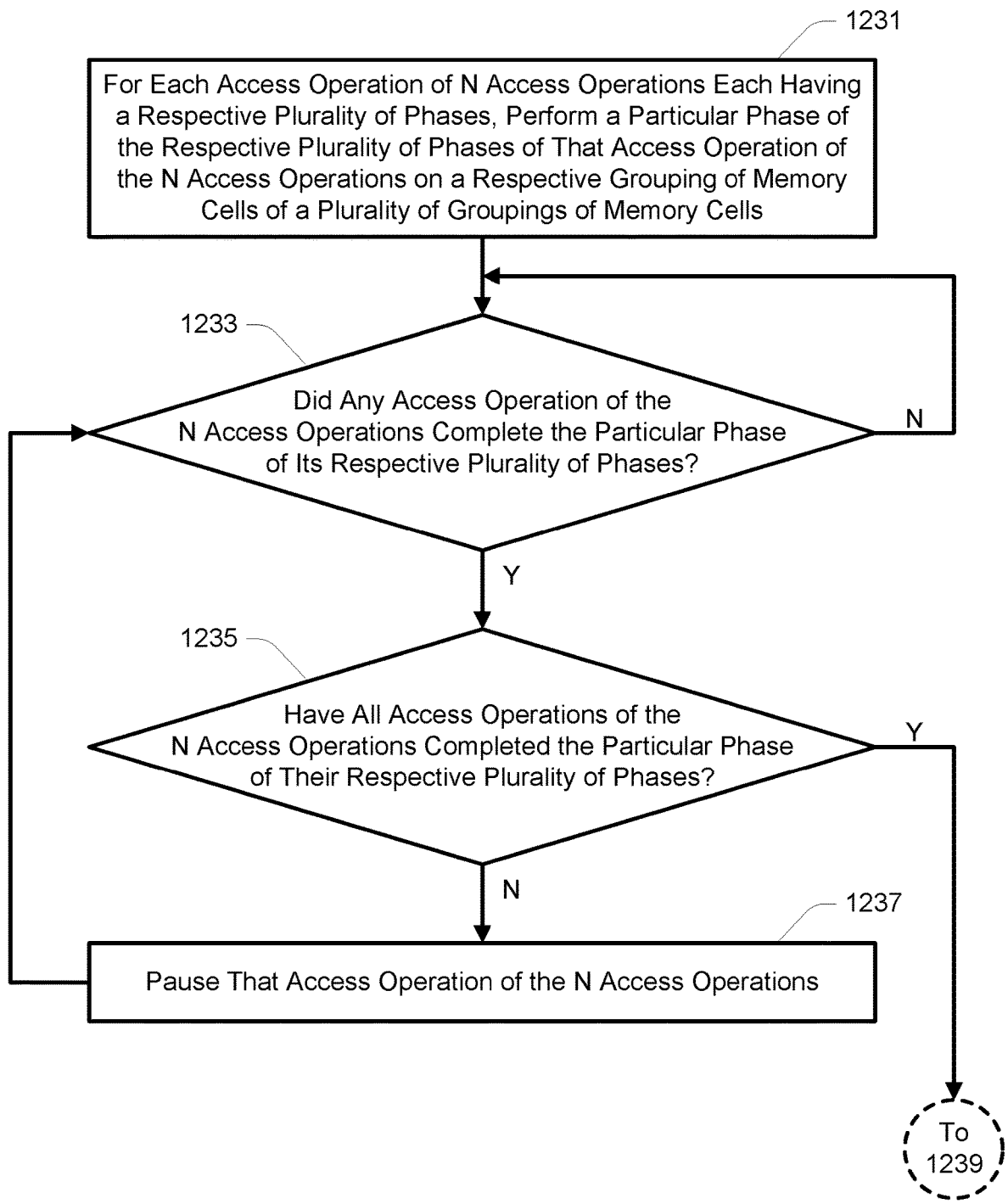
FIGS. 12A-12B are a flowchart of a method of operating a memory in accordance with a further embodiment.
Figure 12B:
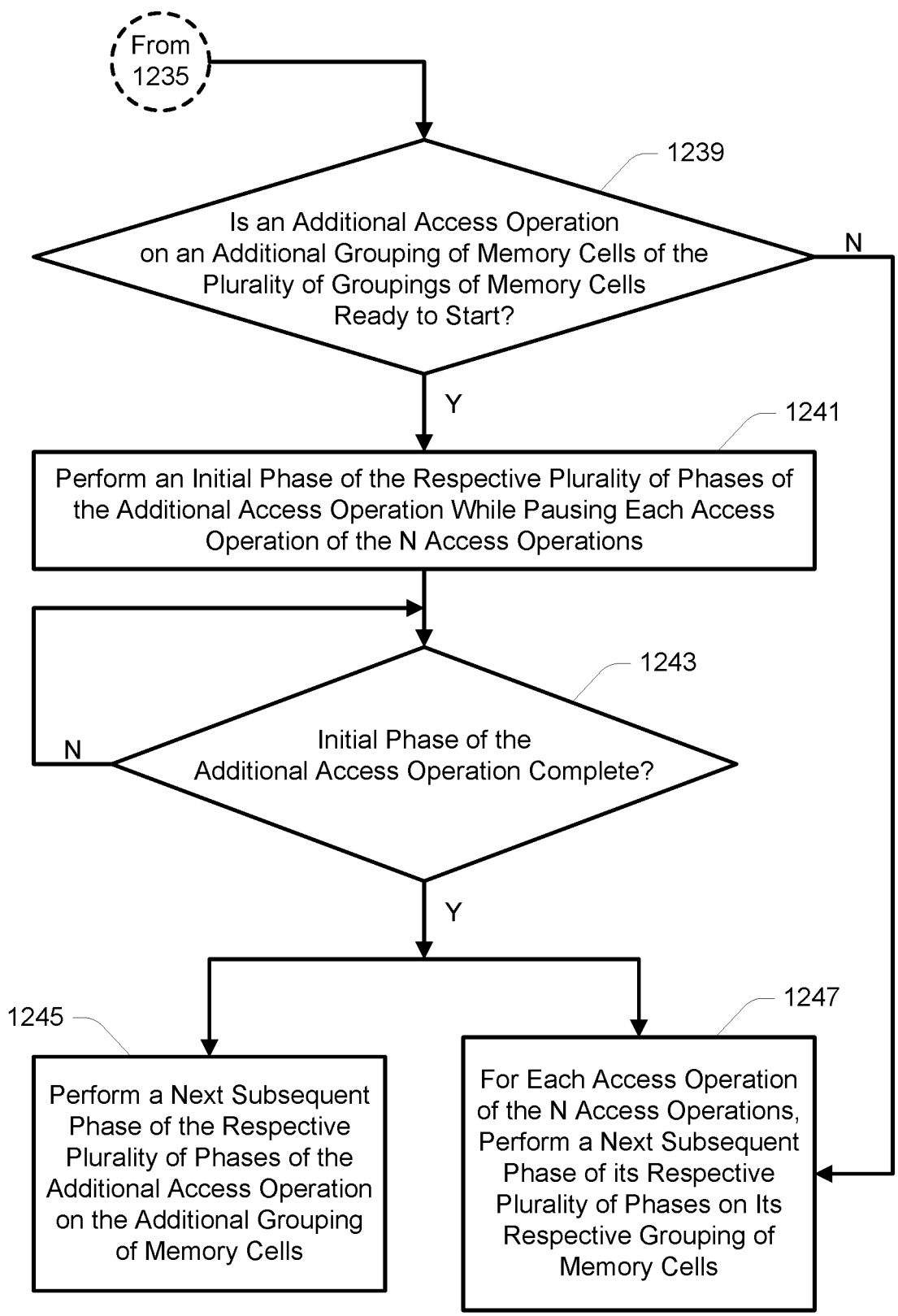

FIGS. 12A-12B are a flowchart of a method of operating a memory in accordance with a further embodiment. For example, FIGS. 12A-12B might correspond to a method of performing two (or more) access operations concurrently on different groupings of memory cells.

At 1231, for each access operation of N access operations, each having a respective plurality of phases, a particular phase of the respective plurality of phases of that access operation of the N access operations might be performed on a respective grouping of memory cells of a plurality of groupings of memory cells. N might be an integer value greater than or equal to two. The respective particular phases of the N access operations might be performed concurrently.

At 1233, it might be determined whether any access operation of the N access operation completed the particular phase of its respective plurality of phases. If no, the process might return to 1233. If yes, the process might proceed to 1235. At 1235, it might be determined whether all access operations of the N access operation completed the particular phase of their respective plurality of phases. If no, the process might proceed to 1237 where the access operation completing the particular phase of its respective plurality of phases might be paused. If yes, the process might proceed to 1239.

At 1239, it might be determined whether an additional access operation on an additional grouping of memory cells of the plurality of groupings of memory cells is ready to start. If no, the process might proceed to 1247 where, for each access operation of the N access operations, a next subsequent phase of its respective plurality of phases might be performed on its respective grouping of memory cells, e.g., concurrently. If yes, the process might proceed to 1241.

At 1241, an initial phase of the respective plurality of phases of the additional access operation might be performed while pausing each access operation of the N access operations. At 1243, it might be determined whether the initial phase of the additional access operation is complete. If no, the process might return to 1243. If yes, the process might proceed to 1245 and 1247, e.g., concurrently. At 1245, a next subsequent phase of the respective plurality of phases of the additional access operation might be performed on the additional grouping of memory cells. At 1361, for each access operation of the N access operations having a next subsequent phase of its respective plurality of phases, the next subsequent phase of its respective plurality of phases might be performed on its respective grouping of memory cells, e.g., concurrently with performing the next subsequent phase of the additional access operation.

For some embodiments, a phase of an (N+1)th access operation on an further grouping of memory cells of the plurality of groupings of memory cells might be performed, e.g., concurrently, with performing the respective particular phases of the N access operations at 1231. At 1233, the (N+1)th access operation might be determined to have completed that access operation.

Figure 13:
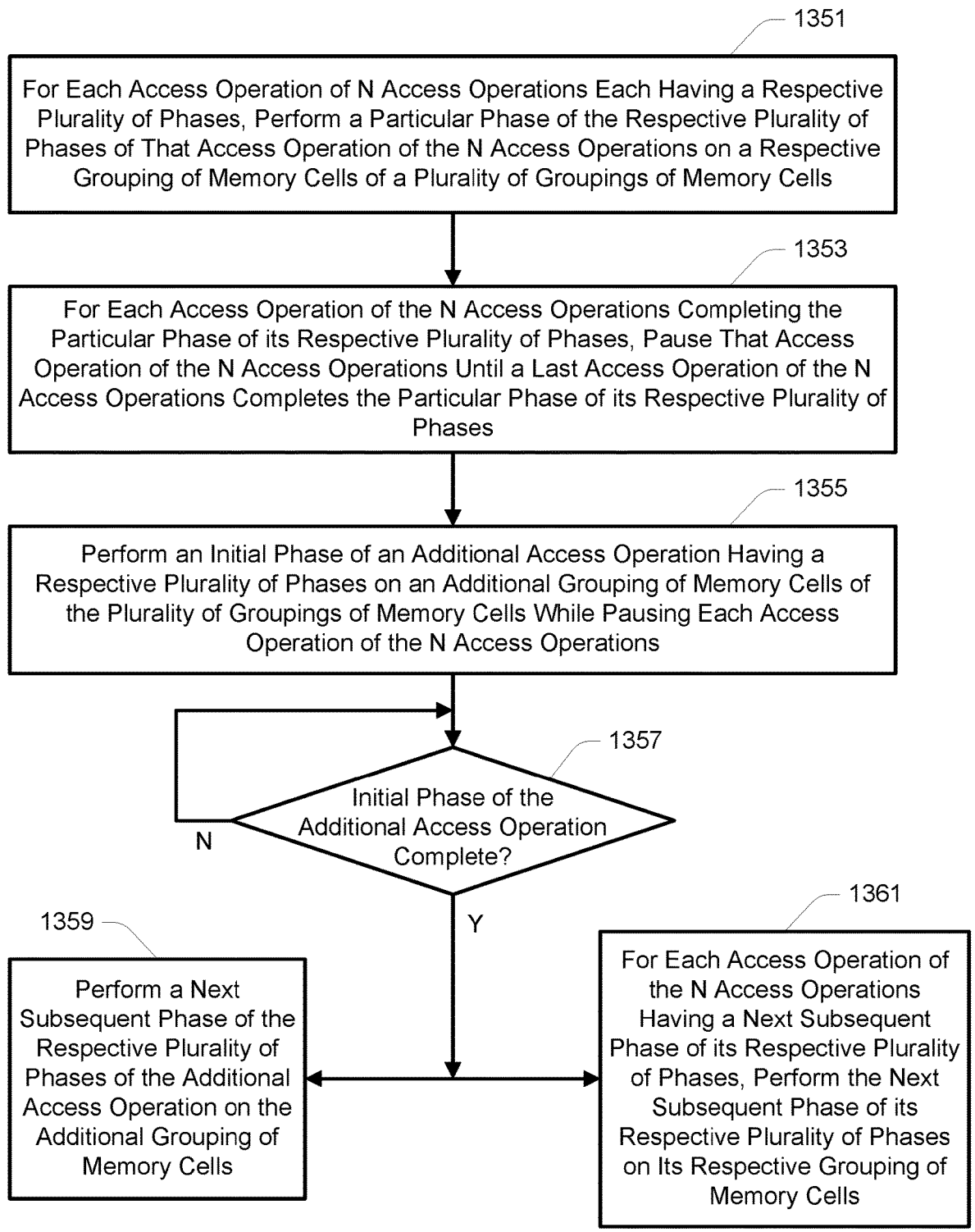
FIG. 13 is a flowchart of a method of operating a memory in accordance with a still further embodiment.

FIG. 13 is a flowchart of a method of operating a memory in accordance with a still further embodiment. For example, FIG. 13 might correspond to a method of performing two (or more) access operations concurrently on different groupings of memory cells.

At 1351, for each access operation of N access operations, each having a respective plurality of phases, a particular phase of the respective plurality of phases of that access operation of the N access operations might be performed on a respective grouping of memory cells of a plurality of groupings of memory cells. N might be an integer value greater than or equal to one. The respective particular phases of the N access operations might be performed concurrently.

At 1353, for each access operation of N access operations completing the particular phase of its respective plurality of phases, that access operation of the N access operations might be paused until a last access operation of the N access operations completes the particular phase of its respective plurality of phases. At 1355, an initial phase of an additional access operation having a respective plurality of phases might be performed on an additional grouping of memory cells of the plurality of groupings of memory cells while pausing each access operation of the N access operations.

At 1357, it might be determined whether the initial phase of the additional access operation is complete. If no, the process might return to 1357. If yes, the process might proceed to 1359 and 1361, e.g., concurrently. At 1359, a next subsequent phase of the respective plurality of phases of the additional access operation might be performed on the additional grouping of memory cells. At 1361, for each access operation of the N access operations having a next subsequent phase of its respective plurality of phases, the next subsequent phase of its respective plurality of phases might be performed on its respective grouping of memory cells, e.g., concurrently with performing the next subsequent phase of the additional access operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory, comprising:
an array of memory cells; and
control logic for access of the array of memory cells;
wherein the control logic is configured to cause the memory to:
perform a first sense operation having an initial phase and a plurality of sensing phases on a first grouping of memory cells of the array of memory cells;
in response to receiving a command to perform a second sense operation on a second grouping of memory cells of the array of memory cells while performing a present sensing phase of the plurality of sensing phases, pausing the first sense operation upon completion of the present sensing phase;
perform an initial phase of the second sense operation after pausing the first sense operation; and
in response to completion of the initial phase of the second sense operation, resume the first sense operation at a next subsequent sensing phase of the plurality of sensing phases and continue to a sensing phase of the second sense operation to perform the next subsequent sensing phase of the first sense operation and the sensing phase of the second sense operation concurrently.

2. The memory of claim 1, wherein the control logic being configured to cause the memory to perform the next subsequent sensing phase of the plurality of sensing phases of the first sense operation and the sensing phase of the second sense operation concurrently comprises the control logic being configured to cause the memory to perform sensing phases of different sense operations concurrently.

3. The memory of claim 1, wherein the control logic being configured to cause the memory to perform the next subsequent sensing phase of the plurality of sensing phases of the first sense operation and the sensing phase of the second sense operation concurrently comprises the control logic being configured to cause the memory to apply a first sense voltage to an access line connected to memory cells of the first grouping of memory cells and apply a second sense voltage to an access line connected to memory cells of the second grouping of memory cells concurrently, wherein the first sense voltage corresponds to the next subsequent sensing phase of the plurality of sensing phases of the first sense operation and the second sense voltage corresponds to the sensing phase of the second sense operation.

4. The memory of claim 1, wherein the control logic is further configured to:
perform a present sensing phase of a plurality of sensing phases of a third sense operation concurrently with performing the present sensing phase of the plurality of sensing phases of the first sense operation;
pause the third sense operation in response to completion of the present sensing phase of the plurality of sensing phases of the third sense operation; and
perform the sensing phase of the second sense operation while the first sense operation and the third sense operation are paused.

5. The memory of claim 4, wherein the control logic being configured to cause the memory to perform the third sense operation concurrently with performing the first sense operation comprises the control logic being configured to cause the memory to perform different sense operations.

6. The memory of claim 1, wherein the control logic being configured to cause the memory to perform the first sense operation on the first grouping of memory cells and to perform the second sense operation on the second grouping of memory cells comprises the control logic being configured to cause the memory to perform the first sense operation on a first memory plane of the array of memory cells and to perform the second sense operation on a second memory plane of the array of memory cells.

7. The memory of claim 1, wherein the control logic being configured to cause the memory to perform the first sense operation on the first grouping of memory cells and to perform the second sense operation on the second grouping of memory cells comprises the control logic being configured to cause the memory to perform the first sense operation on a first logical page of memory cells of the array of memory cells and to perform the second sense operation on a second logical page of memory cells of the array of memory cells.

8. The memory of claim 1, wherein the sensing phase of the second sense operation is an initial sensing phase of a plurality of sensing phases of the second sense operation, and wherein the control logic is further configured to cause the memory to:
in response to receiving a command to perform a third sense operation on a third grouping of memory cells while performing the next subsequent sensing phase of the plurality of sensing phases of the first sense operation or while performing the initial sensing phase of the plurality of sensing phases of the second sense operation:

pause the first sense operation in response to completion of the next subsequent sensing phase of the plurality of sensing phases of the first sense operation and pause the second sense operation in response to completion of the initial sensing phase of the plurality of sensing phases of the second sense operation;
perform an initial phase of the third sense operation on the third grouping of memory cells while the first sense operation and the second sense operation are paused; and
in response to completion of the initial phase of the third sense operation, resume the first sense operation at a further subsequent sensing phase of the plurality of sensing phases of the first sense operation, resume the second sense operation at a next subsequent sensing phase of the plurality of sensing phases of the second sense operation, and continue to a sensing phase of the third sense operation to perform the further subsequent sensing phase of the plurality of sensing phases of the first sense operation, the next subsequent sensing phase of the plurality of sensing phases of the second sense operation, and the sensing phase of the third sense operation concurrently.

9. A memory, comprising:
an array of memory cells; and
control logic for access of the array of memory cells;
wherein the control logic is configured to cause the memory to:
for each access operation of N access operations each having a respective plurality of phases, perform, concurrently, a particular phase of the respective plurality of phases of that access operation of the N access operations on a respective grouping of memory cells of a plurality of groupings of memory cells, where N is an integer value greater than or equal to two;
determine whether any access operation of the N access operations completed the particular phase of its respective plurality of phases;
when an access operation of the N access operations is determined to have completed the particular phase of its respective plurality of phases:
determine whether all access operations of the N access operations have completed the particular phase of their respective plurality of phases;
if any access operation of the N access operations is determined to not have completed the particular phase of its respective plurality of phases, pause the access operation of the N access operations determined to have completed the particular phase of its respective plurality of phases; and
if all access operations of the N access operations are determined to have completed the particular phase of their respective plurality of phases:
for each access operation of the N access operations, perform a next subsequent phase of its respective plurality of phases on its respective grouping of memory cells.

10. The memory of claim 9, wherein the control logic being configured to cause the memory to perform the particular phase of the respective plurality of phases of a particular access operation of the N access operations and perform the particular phase of the respective plurality of phases of a different access operation of the N access operations comprises the control logic being configured to cause the memory to perform different phases of a same access operation.

11. The memory of claim 9, wherein the control logic being configured to cause the memory to perform the particular phase of the respective plurality of phases of a particular access operation of the N access operations and perform the particular phase of the respective plurality of phases of a different access operation of the N access operations comprises the control logic being configured to cause the memory to perform phases of different access operations.

12. The memory of claim 9, wherein, for each access operation of the N access operations, the control logic being configured to cause the memory to perform the particular phase of the respective plurality of phases of that access operation of the N access operations comprises the control logic being configured to cause the memory to apply a respective sense voltage to an access line of the respective grouping of memory cells of that access operation of the N access operations, wherein the respective sense voltage for that access operation of the N access operations corresponds to the particular phase of that access operation of the N access operations.

13. The memory of claim 9, wherein the control logic being configured to cause the memory to apply the respective sense voltage for a particular access operation of the N access operations comprises the control logic being configured to cause the memory to apply a different voltage level than the respective sense voltage for a different access operation of the N access operations.

14. The memory of claim 9, wherein the control logic is further configured to cause the memory to:
  perform a final phase of a respective plurality of phases of a further access operation on a further grouping of memory cells concurrently with performing the particular phase of the respective plurality of phases for each access operation of the N access operations;
  determine whether the further access operation is complete; and
  perform the next subsequent phase of the respective plurality of phases of any access operation of the N access operations only after all access operations of the N access operations are determined to have completed the particular phase of their respective plurality of phases, and the further access operation is determined to be complete.

15. The memory of claim 9, wherein the control logic being configured to cause the memory to perform the particular phase of the respective plurality of phases of a particular access operation of the N access operations comprises the control logic being configured to cause the memory to perform a phase of a sense operation selected from a group consisting of a sense operation to determine lower page (LP) data of a data value of a memory cell, a sense operation to determine upper page (UP) data of the data value of the memory cell, a sense operation to determine extra page (XP) data of the data value of the memory cell, and a sense operation to determine top page (TP) data of the data value of the memory cell.

16. The memory of claim 9, wherein the control logic is further configured to cause the memory to:
  if all access operations of the N access operations are determined to have completed the particular phase of their respective plurality of phases:
    before performing, for each access operation of the N access operations, the next subsequent phase of its respective plurality of phases on its respective grouping of memory cells, determine whether an additional access operation on an additional respective grouping of memory cells of the plurality of groupings of memory cells is ready to start;
    if the additional access operation is ready to start:
      perform an initial phase of a respective plurality of phases of the additional access operation while pausing each access operation of the N access operations, wherein the respective plurality of phases of the additional access operation further comprises a next subsequent phase; and
      in response to completing the initial phase of the additional access operation:
        for each access operation of the N access operations and the additional access operation, perform the next subsequent phase of its respective plurality of phases on its respective grouping of memory cells; and
    if no additional access operation is ready to start:
      for each access operation of the N access operations, perform the next subsequent phase of its respective plurality of phases on its respective grouping of memory cells.

17. A memory, comprising:
  an array of memory cells having a plurality of groupings of memory cells; and
  control logic for access of each grouping of memory cells of the plurality of groupings of memory cells;
  wherein the control logic is configured to cause the memory to:
    perform a multi-phase access operation, of a plurality of multi-phase access operations, on each grouping of memory cells of the plurality of groupings of memory cells;
    for each multi-phase access operation of the plurality of multi-phase operations, perform an initial phase of that multi-phase access operation on only one grouping of memory cells of the plurality of groupings of memory cells at a time;
    for each multi-phase access operation of the plurality of multi-phase operations being performed on any one grouping of memory cells of the plurality of groupings of memory cells, perform a phase other than the initial phase of that multi-phase access operation concurrently with a phase other than the initial phase of any multi-phase access operation of the plurality of multi-phase operations being performed on any other grouping of memory cells of the plurality of groupings of memory cells.

18. The memory of claim 17, wherein the memory further comprises:
  a command queue in communication with the control logic and configured to receive commands for performing the multi-phase access operations of the plurality of multi-phase access operations;
  wherein the control logic is configured to cause the memory to process queued commands for performing multi-phase access operations of the plurality of multi-phase access operations for each grouping of memory cells of the plurality of groupings of memory cells on a first-in-first-out (FIFO) basis for each grouping of memory cells of the plurality of groupings of memory cells.

19. The memory of claim 17, wherein the control logic is configured to cause the memory to access any grouping of memory cells of the plurality of groupings of memory cells independently of access of any other grouping of memory cells of the plurality of groupings of memory cells, and wherein the control logic is further configured to cause the memory to access each grouping of memory cells of the plurality of groupings of memory cells concurrently with any other grouping of memory cells of the plurality of groupings of memory cells.

20. The memory of claim 17, wherein the control logic comprises:
- a decision logic in communication with the command queue;
- a thread state monitor in communication with the decision logic; and
- a plurality of state machines in communication with the thread state monitor;
- wherein the plurality of state machines comprises a respective state machine for each grouping of memory cells of the plurality of groupings of memory cells; and
- wherein, for each grouping of memory cells of the plurality of groupings of memory cells, the respective state machine for that grouping of memory cells is configured to perform each multi-phase access operation of the plurality of multi-phase access operations in response to respective firmware for that state machine.

* * * * *